United States Patent
Russek et al.

(10) Patent No.: US 12,416,694 B2
(45) Date of Patent: Sep. 16, 2025

(54) HYPERPOLARIZATION MICRO-MAGNETIC RESONANCE IMAGER AND THREE-DIMENSIONAL IMAGING OF A BIOLOGICAL COMPOSITION WITH CELLULAR RESOLUTION

(71) Applicant: Government of the United States of America, as represented by the Secretary of Commerce, Gaithersburg, MD (US)

(72) Inventors: Stephen E. Russek, Louisville, CO (US); Karl Francis Stupic, Westminster, CO (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 185 days.

(21) Appl. No.: 18/370,205

(22) Filed: Sep. 19, 2023

(65) Prior Publication Data
US 2024/0094316 A1 Mar. 21, 2024

Related U.S. Application Data

(60) Provisional application No. 63/407,897, filed on Sep. 19, 2022.

(51) Int. Cl.
 G01R 33/28 (2006.01)
 G01R 33/07 (2006.01)
 G01R 33/385 (2006.01)
 G01R 33/3875 (2006.01)

(52) U.S. Cl.
 CPC .......... *G01R 33/282* (2013.01); *G01R 33/07* (2013.01); *G01R 33/3852* (2013.01); *G01R 33/3875* (2013.01)

(58) Field of Classification Search
 CPC .. G01R 33/282; G01R 33/07; G01R 33/3852; G01R 33/3875; G01R 33/302; G01R 33/48
 See application file for complete search history.

(56) References Cited

U.S. PATENT DOCUMENTS

2019/0369175 A1* 12/2019 Schwartz .......... G01R 33/5601
2020/0292640 A1* 9/2020 Rahimi-Keshari .... G01N 24/08
2021/0255126 A1* 8/2021 Acosta .................. G01N 24/12

\* cited by examiner

*Primary Examiner* — G. M. A Hyder
(74) *Attorney, Agent, or Firm* — Office of Chief Counsel for National Institute of Standards and Technology

(57) ABSTRACT

A hyperpolarization micro-magnetic resonance imager for three-dimensional imaging of a biological composition with cellular resolution includes a hyperpolarizer source, hyperpolarizer transmission line, an NMR console, a nuclear magnetic resonance tuned circuit, an imaging cell, a magnet, a gradient-shim coil, a Hall probe and thermometer, and a printed circuit board.

13 Claims, 14 Drawing Sheets

HYPERPOLARIZATION MICRO-MAGNETIC RESONANCE IMAGER AND THREE-DIMENSIONAL IMAGING OF A BIOLOGICAL COMPOSITION WITH CELLULAR RESOLUTION

CROSS REFERENCE TO RELATED APPLICATIONS

This application claims the benefit of U.S. Provisional Patent Application Ser. No. 63/407,897 (filed Sep. 19, 2022), which is herein incorporated by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in this invention.

BRIEF DESCRIPTION

Disclosed is a hyperpolarization micro-magnetic resonance imager for three-dimensional imaging of a biological composition with cellular resolution comprising: a hyperpolarizer source in electrical communication with a hyperpolarizer transmission line and in electrical communication with a NMR console, a nuclear magnetic resonance tuned circuit in electrical communication with a transcoupler and in electrical communication with an integrated imaging cell, a magnet in electrical communication with a magnet supply and in magnetic communication with an imaging cell, a gradient-shim coil in magnetic communication with the magnet and in magnetic communication with the imaging cell, a Hall probe and thermometer in electrical communication with a digital control system and a printed circuit board with an integrated shield in mechanical communication with the hyperpolarizer transmission line, the integrated imaging cell, the hyperpolarizer, the bioreactor, and the nuclear magnetic resonance tuned circuit, the integrated imaging cell, the hyperpolarizer, the bioreactor disposed on the printed circuit board with an integrated shield and disposed on the hyperpolarizer transmission line, the integrated imaging cell, the hyperpolarizer, the bioreactor, and the Hall probe and thermometer interposed between a pair of magnets and a pair of gradient-shim coils.

Disclosed is a process for three-dimensional imaging of a biological composition with cellular resolution with a hyperpolarization micro-magnetic resonance imager, the process comprising: providing a biological composition to be imaged; disposing the biological composition in an imaging cell; providing a hyperpolarizer microwave signal to the imaging cell via a hyperpolarizer transmission line; applying a magnetic field to the imaging cell; and acquiring an image of the biological composition from the imaging cell.

BRIEF DESCRIPTION OF THE DRAWINGS

The following description cannot be considered limiting in any way. Various objectives, features, and advantages of the disclosed subject matter can be more fully appreciated with reference to the following detailed description of the disclosed subject matter when considered in connection with the following drawings, in which like reference numerals identify like elements.

DETAILED DESCRIPTION

Figure 1:
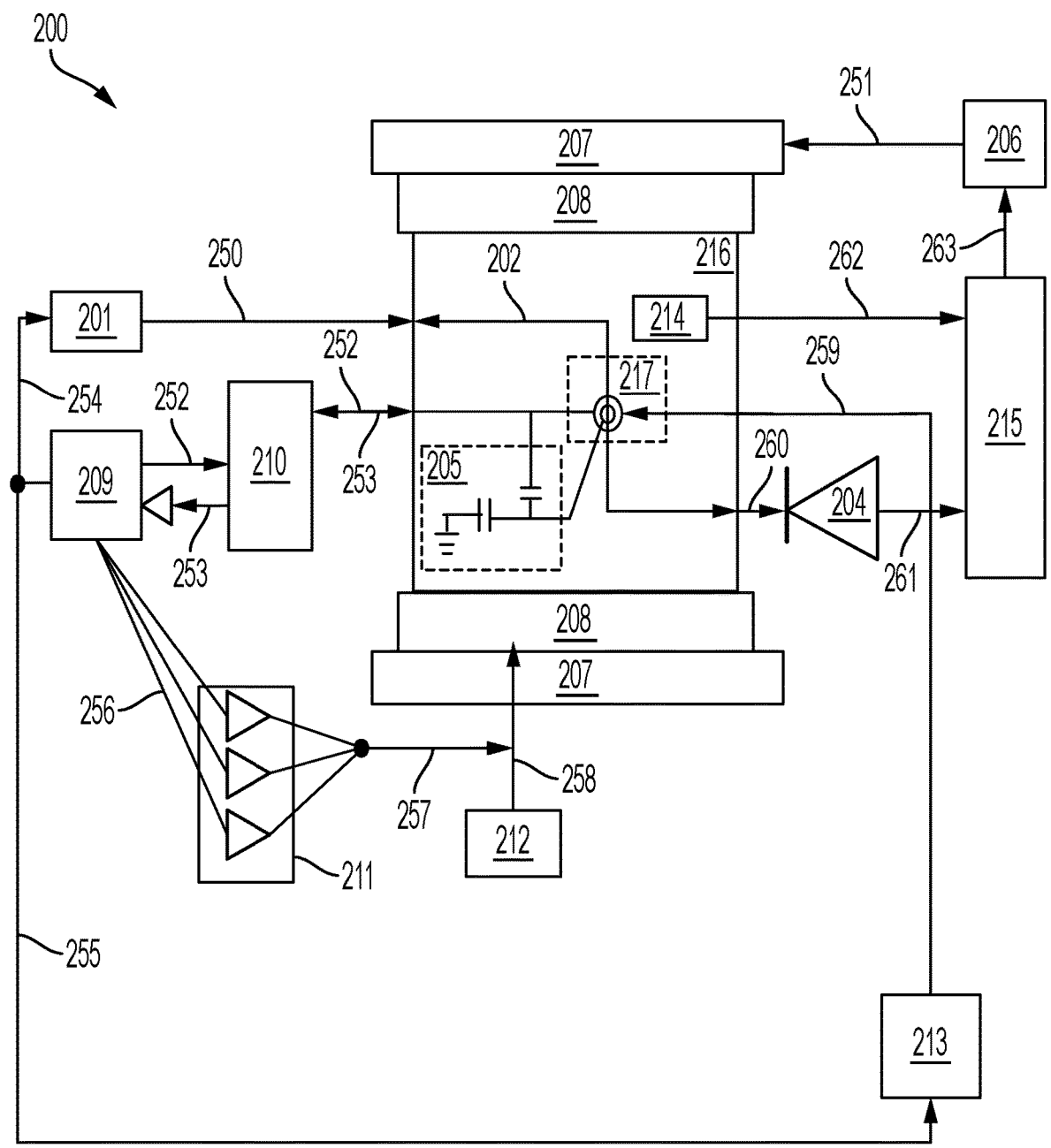
FIG. 1 shows, according to some embodiments, a hyperpolarization micro-magnetic resonance imager 200.
Figure 2:
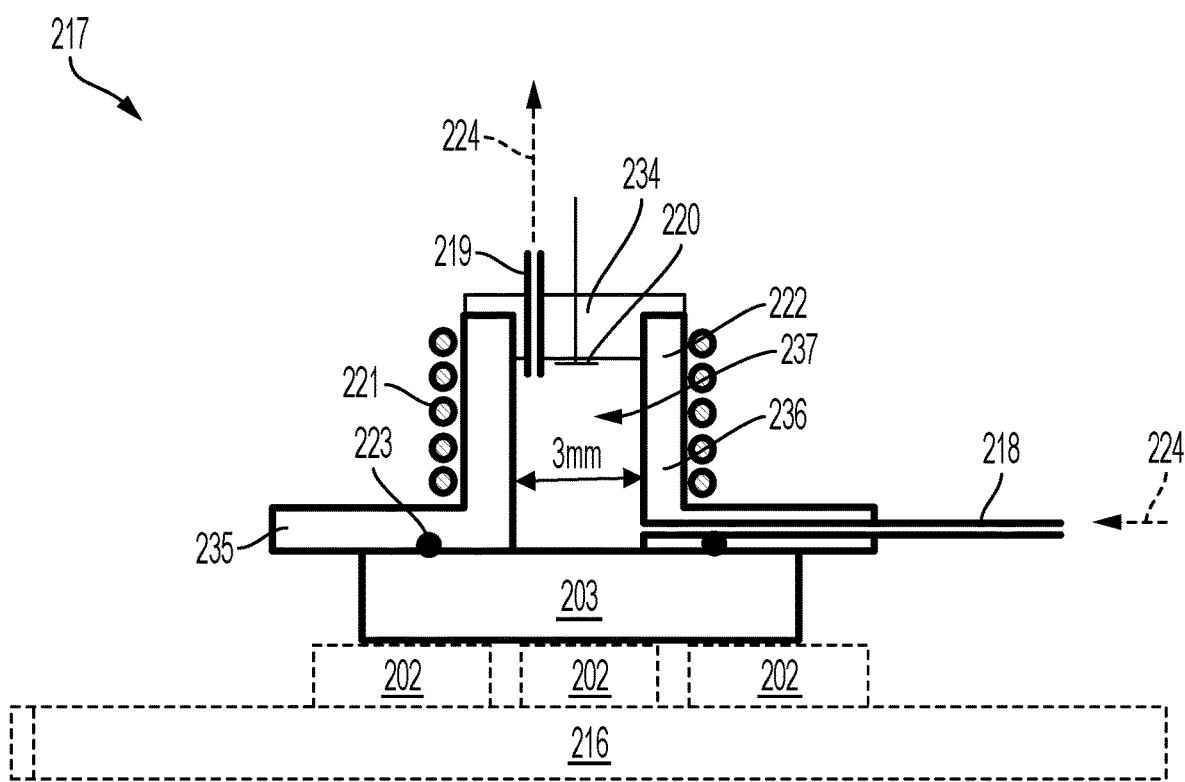
FIG. 2 shows, according to some embodiments, an integrated imaging cell, hyperpolarizer, bioreactor 217.
Figure 3:
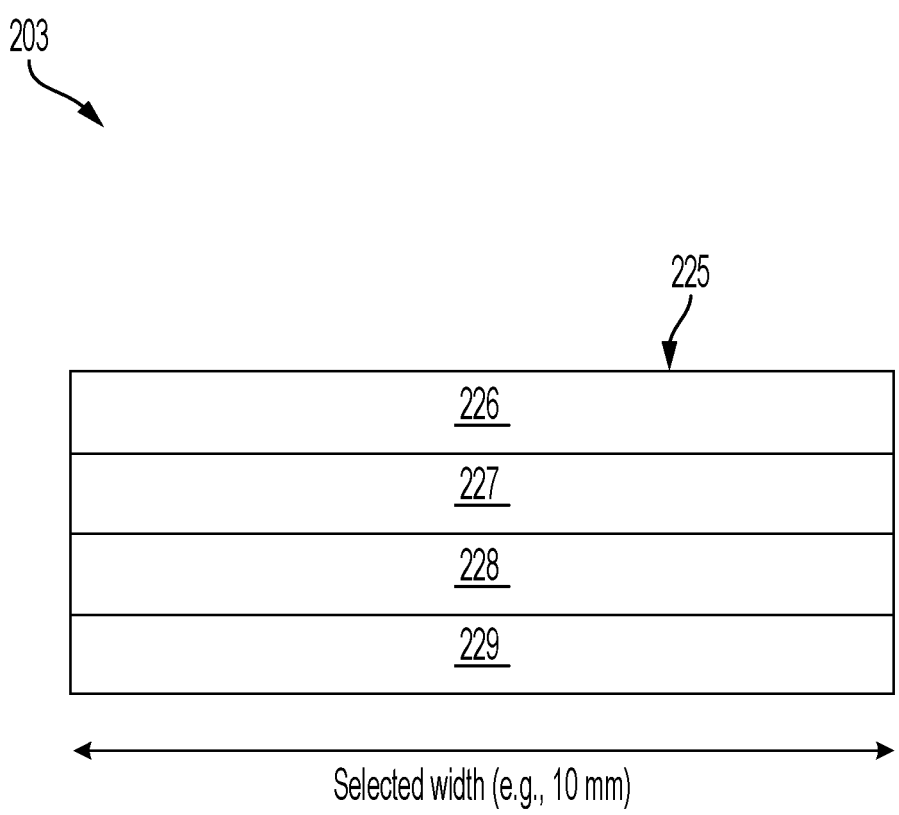
FIG. 3 shows, according to some embodiments, a hyperpolarizer film stack 203.

A detailed description of one or more embodiments is presented herein by way of exemplification and not limitation.

It has been discovered that a hyperpolarization micro-magnetic resonance imager 200 provides three-dimensional imaging of biological composition 224 with cellular resolution. Advantageously, hyperpolarization micro-magnetic resonance imager 200 is compact, portable, and cost-effective. Furthermore, hyperpolarization micro-magnetic resonance imager 200 provides images of biologically-relevant samples such as normal and tumor cells that can be used to determine pharmaceutical efficacy of drug compounds and radiation therapies. It is contemplated that hyperpolarization micro-magnetic resonance imager 200 provides 3-dimensional imaging of biopsies and cell organoids in a fast, noninvasive manner. Conventional optical imaging technologies are comparatively slow, not fully 3-dimensional, and destroy or harm cells being examined. Moreover, hyperpolarization of water protons can increase signal in magnetic resonance imaging (MRI) systems enabling microMRI of tissue and cellular structure. Advantageously hyperpolarization micro-magnetic resonance imager 200 includes a solid state hyperpolarizer that uses ferromagnetic resonance and operates at low field and room temperature in contrast to conventional systems that involve high fields or low temperature. Beneficially, hyperpolarization micro-magnetic resonance imager 200 can provide point-of-use hyperpolarization for infusion of a biological composition within the spin relaxation time of water, approximately 2 to 3 seconds. Further, hyperpolarization micro-magnetic resonance imager 200 provides separation of hyperpolarization media and prevents contamination of the biological composition from the hyperpolarization media.

Hyperpolarization micro-magnetic resonance imager 200 performs three-dimensional imaging of a biological composition with cellular resolution. In an embodiment, with reference to FIG. 1, FIG. 2, FIG. 3, FIG. 4, FIG. 5, FIG. 6, FIG. 8, FIG. 9, and FIG. 10, hyperpolarization micro-magnetic resonance imager 200 for three-dimensional imaging of a biological composition with cellular resolution includes: hyperpolarizer source 201 in electrical communication with hyperpolarizer transmission line 202 and in electrical communication with NMR console 209 and in electrical communication with integrated imaging cell, hyperpolarizer, bioreactor 217 and that receives hyperpolarizer control signal 254 from NMR console 209, produces hyperpolarizer microwave signal 250 from hyperpolarizer control signal 254, and communicates hyperpolarizer microwave signal 250 to integrated imaging cell, hyperpolarizer, bioreactor 217 via hyperpolarizer transmission line 202; hyperpolarizer transmission line 202 disposed on printed circuit board with integrated shield 216 and in electrical communication with hyperpolarizer source 201 and in electrical communication with integrated imaging cell and that receives hyperpolarizer microwave signal 250 from hyperpolarizer source 201 and communicates hyperpolarizer microwave signal 250 to integrated imaging cell, hyperpolarizer, bioreactor 217; nuclear magnetic resonance tuned circuit 205 disposed on printed circuit board with integrated shield 216 and in electrical communication with transcoupler 210 and in electrical communication with integrated imaging cell and that is capacitively coupled to transcoupler 210 and nuclear magnetic resonance coil 221 of integrated imaging cell, hyperpolarizer, bioreactor 217, tunes nuclear magnetic resonance coil 221 to resonate at the same frequency as the proton precession frequency of protons in imaging cell 222, and provides an impedance so that a maximum RF power is delivered to biological composition 224 disposed in imaging cell 222; magnet 207 disposed on printed circuit board with integrated shield 216 and in electrical communication with magnet supply 206 and in magnetic communication with imaging cell 222 and that receives magnetic field modulation signal 251 from magnet supply 206, produces magnetic field 231 for performing magnetic resonance imaging of biological composition 224 in imaging cell 222, and communicates magnetic field 231 to imaging cell 222; gradient-shim coil 208 disposed on printed circuit board with integrated shield 216 and in magnetic communication with magnet 207 and in magnetic communication with imaging cell 222 and that is interposed between magnet 207 and imaging cell 222, increases homogeneity of magnetic field 231, and provides a magnetic field gradient for nuclear magnetic resonance imaging; Hall probe and thermometer 214 disposed on printed circuit board with integrated shield 216 and in electrical communication with digital control system 215 and that measure magnetic field 231 and temperature of imaging cell 222, produces magnetic sensor signal 262 that indicates the temperature of imaging cell 222 and strength of magnetic field 231, and communicates magnetic sensor signal 262 to digital control system 215; printed circuit board with integrated shield 216 in mechanical communication with hyperpolarizer transmission line 202 and in mechanical communication with integrated imaging cell and in mechanical communication with hyperpolarizer and in mechanical communication with bioreactor 217, such that hyperpolarizer transmission line 202, integrated imaging cell, hyperpolarizer, bioreactor 217, and nuclear magnetic resonance tuned circuit 205 are disposed and arranged on printed circuit board with integrated shield 216, such that integrated imaging cell, hyperpolarizer, bioreactor 217 and Hall probe and thermometer 214 are interposed between a pair of magnets 207 and a pair of gradient-shim coils 208; and integrated imaging cell, hyperpolarizer, bioreactor 217 disposed on printed circuit board with integrated shield 216 and disposed on hyperpolarizer transmission line 202 and in mechanical communication with printed circuit board with integrated shield 216 and in mechanical communication with hyperpolarizer transmission line 202 and that comprises hyperpolarizer film stack 203, imaging cell 222, and nuclear magnetic resonance coil 221.

In an embodiment, hyperpolarization micro-magnetic resonance imager 200 includes: hyperpolarizer film stack 203 disposed on printed circuit board with integrated shield 216 and in electrical communication with hyperpolarizer transmission line 202 and in fluid communication with biological composition 224 and that receives hyperpolarizer microwave signal 250 from hyperpolarizer transmission line 202, produces electron spin polarization from hyperpolarizer microwave signal 250, receives biological composition 224, and produces hyperpolarized water 230 from spin transfer interaction of polarized electrons in hyperpolarizer film stack 203 with water in biological composition 224.

In an embodiment, hyperpolarization micro-magnetic resonance imager 200 includes: microwave detector 204 in electrical communication with 217 and in electrical communication with 215 and that receives hyperpolarizer MW transmit signal 260 from integrated imaging cell, hyperpolarizer, bioreactor 217, detects microwave power of hyperpolarizer MW transmit signal 260, and produces hyperpolarizer power signal 261 from hyperpolarizer power signal 261, such that hyperpolarizer power signal 261 indicates the microwave power of hyperpolarizer MW transmit signal 260.

In an embodiment, hyperpolarization micro-magnetic resonance imager 200 includes: magnet supply 206 in electrical communication with digital control system 215 and in electrical communication with magnet 207 and that receives magnet control signal 263 from digital control system 215, produces magnetic field modulation signal 251 from magnet control signal 263, and communicates magnetic field modulation signal 251 to magnet 207, such that magnet supply 206 adjusts and sweeps magnetic field 231 so that the proton precession frequency is matched to the resonance of nuclear magnetic resonance coil 221 and monitors ferromagnetic resonance of hyperpolarizer film stack 203.

In an embodiment, hyperpolarization micro-magnetic resonance imager 200 includes: NMR console 209 in electrical communication with hyperpolarizer source 201 and in electrical communication with transcoupler 210 and in electrical communication with cell controller 213 and in electrical communication with gradient amplifiers 211, such that NMR console 209 receives NMR receive signal 253 from transcoupler 210, produces hyperpolarizer control signal 254, imaging cell electrode and flow control signal 255, gradient waveform (x, y, z) 256, and NMR transmit signal 252 in response to receipt of NMR receive signal 253, communicates NMR transmit signal 252 to transcoupler 210, communicates hyperpolarizer control signal 254 to hyperpolarizer source 201, communicates imaging cell electrode and flow control signal 255 to cell controller 213, and communicates gradient waveform (x, y, z) 256 to gradient amplifiers 211.

In an embodiment, hyperpolarization micro-magnetic resonance imager 200 includes: transcoupler 210 in electrical communication with NMR console 209 and in electrical communication with nuclear magnetic resonance coil 221, such that transcoupler 210 receives NMR transmit signal 252 from NMR console 209, communicates NMR transmit signal 252 to nuclear magnetic resonance coil 221, receives NMR receive signal 253 from nuclear magnetic resonance coil 221, and communicates NMR receive signal 253 to NMR console 209.

In an embodiment, hyperpolarization micro-magnetic resonance imager 200 includes: gradient amplifiers 211 in electrical communication with NMR console 209 and in electrical communication with gradient-shim coil 208, such that gradient amplifiers 211 receives gradient waveform (x, y, z) 256 from NMR console 209, produces gradient drive current 257 from gradient waveform (x, y, z) 256, and communicates gradient drive current 257 to gradient-shim coil 208 to drive gradient-shim coil 208.

In an embodiment, hyperpolarization micro-magnetic resonance imager 200 includes: shim controller 212 in electrical communication with gradient-shim coil 208 and produces shim current 258 and communicates shim current 258 to gradient-shim coil 208 to adjust homogeneity of magnetic field 231 in imaging cell 222.

In an embodiment, hyperpolarization micro-magnetic resonance imager 200 includes: cell controller 213 in electrical communication with NMR console 209 and in electrical communication with imaging cell 222 and receives imaging cell electrode and flow control signal 255 from NMR console 209, and produces hyperpolarizer MW transmit signal 260 based on imaging cell electrode and flow control signal 255, such that cell controller 213 controls electrode bias, temperature read out, and fluid flow of imaging cell 222.

In an embodiment, hyperpolarization micro-magnetic resonance imager 200 includes: digital control system 215 in electrical communication with magnet supply 206 and in electrical communication with Hall probe and thermometer 214 and in electrical communication with microwave detector 204 and receives hyperpolarizer power signal 261 from microwave detector 204, receives magnetic sensor signal 262 from Hall probe and thermometer 214, monitors ferromagnetic resonance of hyperpolarizer film stack 203 from hyperpolarizer power signal 261, and produces magnet control signal 263 to adjust the microwave drive frequency of magnet supply 206 to be at the magnetic resonance frequency of imaging cell 222.

In an embodiment, imaging cell 222 includes: base fluid channel 218 disposed on cell flange 235 and in mechanical communication with cell flange 235 and in fluid communication with interior sample volume 237 and that receives biological composition 224, communicates biological composition 224 to interior sample volume 237; cap fluid channel 219 disposed on cell cap 234 and in mechanical communication with cell cap 234 and in fluid communication with interior sample volume 237 and that receives biological composition 224 from interior sample volume 237 and communicates biological composition 224 out of imaging cell 222; cap electrode 220 disposed on cell cap 234 and in mechanical communication with cell cap 234 and in electrical communication with hyperpolarizer film stack 203 and that receives electrical potential relative to hyperpolarizer film stack 203, provide an electrical bias across interior sample volume 237, and provides electrochemical spin control of imaging cell 222; nuclear magnetic resonance coil 221 disposed on imaging cell 222 and in mechanical communication with imaging cell 222 and in electrical communication with transcoupler 210 and in electrical communication with nuclear magnetic resonance tuned circuit 205 and that receives NMR transmit signal 252 from NMR console 209 via transcoupler 210, communicates NMR transmit signal 252 to biological composition 224 in imaging cell 222, receives NMR receive signal 253 from biological composition 224 in imaging cell 222; imaging cell 222 disposed on printed circuit board with integrated shield 216 and in mechanical communication with printed circuit board with integrated shield 216 and that comprises cell wall 236 that surroundingly bounds interior sample volume 237, cell flange 235 that mechanically engages hyperpolarizer film stack 203 and through which is disposed base fluid channel 218, and cell cap 234 through which is disposed cap fluid channel 219, such that hyperpolarizer film stack 203 is interposed between cell flange 235 and hyperpolarizer transmission line 202, and hyperpolarizer transmission line 202 is interposed between hyperpolarizer film stack 203 and printed circuit board with integrated shield 216, O-ring seal 223 in mechanical communication with imaging cell 222 and in mechanical communication with hyperpolarizer film stack 203 and that mechanically engages cell flange 235 of imaging cell 222 and hyperpolarizer film stack 203 and fluidically seals imaging cell 222 to hyperpolarizer film stack 203; cell cap 234 that fluidically seals imaging cell 222 and receives cap fluid channel 219; cell flange 235 that fluidically seals imaging cell 222 against hyperpolarizer film stack 203; cell wall 236 that bounds interior sample volume 237; interior sample volume 237 that bounded by interior sample volume 237

In an embodiment, hyperpolarizer film stack 203 includes: spin interface layer 225 exposed to interior sample volume 237 to fluidically interface hyperpolarizer film stack 203 with biological composition 224 in interior sample volume 237 of imaging cell 222 such that water in biological composition 224 hydrogen bonds to spin interface layer 225 and undergoes spin exchange to become hyperpolarized water 230; polarized electron transport layer 226 that extracts electrons from ferromagnetic resonance layer 227 and comprises a nonmagnetic material that transports conduction electron spins to spin interface layer 225; ferromagnetic resonance layer 227 that is interposed between polarized electron transport layer 226 and printed circuit board with integrated shield 216, comprises a magnetic material and a ferromagnetic resonance, converts angular momentum from microwave field 233 into mobile conduction electrons that are communicated to polarized electron transport layer 226; adhesion layer 228 that is interposed between ferromagnetic resonance layer 227 and printed circuit board with integrated shield 216, enhance adhesion of ferromagnetic resonance layer 227 to substrate 229; substrate 229 that is interposed between ferromagnetic resonance layer 227 and printed circuit board with integrated shield 216 and communicates microwave field 233 to ferromagnetic resonance layer 227 from hyperpolarizer transmission line 202

Hyperpolarization micro-magnetic resonance imager 200 can be made of various elements and components that can be assembled together or fabricated. Elements of hyperpolarization micro-magnetic resonance imager 200 can be various sizes and shapes. Elements of hyperpolarization micro-magnetic resonance imager 200 can be made of a material that is physically or chemically resilient in an environment in which hyperpolarization micro-magnetic resonance imager 200 is disposed. Exemplary materials include a metal, ceramic, thermoplastic, glass, semiconductor, and the like. The elements of hyperpolarization micro-magnetic resonance imager 200 can be made of the same or different material and can be monolithic in a single physical body or can be separate members that are physically joined. Hyperpolarization micro-magnetic resonance imager 200 can be a compact, portable device that can be used to image biological samples with cellular resolution.

In hyperpolarization micro-magnetic resonance imager 200, hyperpolarizer source 201 generates a microwave signal that is used to hyperpolarize a biological sample. Hyperpolarizer source 201 can include a microwave generator, a power amplifier, and a circulator. In some embodiments, hyperpolarizer source 201 can include a compact microwave signal generator (hyperpolarizer supply) that is capable of outputting a 1 GHz to 228 GHz signal. The signal generator must be controlled with the system computer and gated by the console generating the pulse sequence. A microwave amplifier can have up to 100 mW microwave power to drive the hyperpolarizer. In some implementations, the microwave generator can generate a microwave signal at a frequency of approximately 95 GHz. The circulator ensures that the microwave signal travels in a single direction through hyperpolarizer 201. Hyperpolarizer source 201 can be operated in a pulsed mode. The microwave signal is generated for a short period of time (e.g., 100 microseconds) and then turned off. This allows the biological sample to absorb the microwave energy and become hyperpolarized. It is contemplated that microwave generator generates a microwave signal and can be a Gunn oscillator. The power amplifier amplifies the microwave signal to a selected power level and can be a traveling-wave tube amplifier. The circulator can be a three-port circulator. The input power to hyperpolarizer source 201 can be, e.g., 10-20 volts. The output power of hyperpolarizer source 201 can be, e.g., 100 milliwatts. The pulse width of hyperpolarizer source 201 can be, e.g., 100 microseconds.

In hyperpolarization micro-magnetic resonance imager 200, hyperpolarizer transmission line 202 can transmit a hyperpolarization signal to a sample 204 and can be a stripline or a microstripline. In an embodiment, hyperpolarizer transmission line 202 is a 50-Ohm coplanar waveguide integrated on the printed circuit board and transmits microwave power to the hyperpolarizer thin film stack. A thickness of hyperpolarizer transmission line 202 can be selected based, e.g., on the operating frequency and can be from 0.5 to 20 mils, specifically from 0.5 to 10 mils, and more specifically from 0.5 to 5 mils. A width W of hyperpolarizer transmission line 202 can be selected based, e.g., on the operating frequency and can be from 0.5 to 20 mils, specifically from 0.5 to 10 mils, and more specifically from 0.5 to 5 mils. Moreover, hyperpolarizer transmission line 202 can have a length of 10 to 100 mils. In one aspect, hyperpolarizer transmission line 202 has a characteristic impedance of 50 to 75 ohms. Moreover, hyperpolarizer transmission line 202 has a dielectric constant of 3.5 to 4.5. In some implementations, hyperpolarizer transmission line 202 has a loss tangent of 0.001 to 0.005. Hyperpolarizer transmission line 202 of hyperpolarization micro-magnetic resonance imager 200 can be connected to a coaxial transmission line that is used to transmit hyperpolarizer microwave signal 250 from hyperpolarizer source 201 to integrated imaging cell, hyperpolarizer, bioreactor 217. Hyperpolarizer transmission line 202 can include a center conductor, an outer conductor 253, and dielectric disposed between the center conductor and the outer conductor. The center conductor can be made of copper or a copper alloy, and the outer conductor can be made of stainless steel or aluminum. The dielectric can be made of a polymer such as polyethylene or Teflon. Hyperpolarizer transmission line 202 is a low-loss transmission line because it does not dissipate much power as hyperpolarizer microwave signal 250 travels along the line so that loss of power is avoided to maintain efficiency of the hyperpolarization process. Hyperpolarizer transmission line 202 is also a high-impedance transmission line, meaning that it presents a high impedance to hyperpolarizer microwave signal 250 so that it prevents hyperpolarizer microwave signal 250 from reflecting back from the end of the line and interfering with the hyperpolarization process. Hyperpolarizer transmission line 202 can be a few centimeters in length, and it is terminated with a load impedance that matches the characteristic impedance of the line. The load impedance can be a 50-ohm resistor. Hyperpolarizer microwave signal 250 is applied to the input of the line, and hyperpolarizer microwave signal 250 is transmitted along the line to the output. Hyperpolarizer microwave signal 250 is then applied to hyperpolarizer film stack 203 of integrated imaging cell, hyperpolarizer, bioreactor 217 to perform hyperpolarization. To make hyperpolarizer transmission line 202, a variety of methods can be used, including lithography and etching.

In hyperpolarization micro-magnetic resonance imager 200, hyperpolarizer film stack 203 can include a microwave transparent substrate 229 to provide unobstructed transmission of microwave frequencies therethrough and can be a flexible substrate or a rigid substrate. A thickness of hyperpolarizer film stack 203 can be selected based, e.g., on the thickness of the plurality of hyperpolarizing layers and can be from 100 nm to 1000 nm, specifically from 150 nm to 500 nm, and more specifically from 200 nm to 400 nm. A width W of hyperpolarizer film stack 203 can be selected based, e.g., on the width of the plurality of polarizing layers 207 and can be from 500 nm to 5000 nm, specifically from 750 nm to 3000 nm, and more specifically from 1000 nm to 2500 nm. Moreover, hyperpolarizer film stack 203 can be electrically nonconductive, optically transparent, and mechanically stable. In one aspect, hyperpolarizer film stack 203 has a sheet resistance of 100 Ohms/square or less. Moreover, hyperpolarizer film stack 203 has a transmittance of 90% or more. In some implementations, hyperpolarizer film stack 203 has a hardness of 6H or greater. Hyperpolarizer film stack 203 has a number of physical properties that make it suitable for use in a hyperpolarization micro-magnetic resonance imager. These properties include: high electron spin polarization to produce a strong hyperpolarization microwave signal and long spin coherence time to maintain the electron spin polarization for a long period of time. Hyperpolarizer film stack 203 does not have to be, but can be, operated in a cryogenic environment to minimize thermal noise and maximize the spin coherence time. The operating temperature of hyperpolarizer film stack 203 can be from a few Kelvin to greater than room temperature. The hyperpolarizer thin film stack can include thin film layers (225, 226, 227, 228) that develop election spin polarization from the microwave input, transport it to the surface, and provide an efficient spin transfer interface to the proton spins. The top surface (225), in contact with the biological sample, can be the base electrode for the imaging cell.

Hyperpolarizer film stack 203 includes polarized electron transport layer 226 that is a nonmagnetic layer that transports conduction electron spins to the surface 225 of hyperpolarizer film stack 203. A thickness of polarized electron transport layer 226 can be selected based, e.g., on the required electron transport distance and can be from 10 nm to 100 nm, specifically from 20 nm to 40 nm, and more specifically from 30 nm to 35 nm. A width W of polarized electron transport layer 226 can be selected based, e.g., on the required electron transport distance and can be from 100 nm to 200 nm, specifically from 150 nm to 170 nm, and more specifically from 160 nm to 165 nm. Moreover, polarized electron transport layer 226 can be electrically conductive and optically transparent. In one aspect, polarized electron transport layer 226 has a resistivity of less than 100 mΩ-cm. Moreover, polarized electron transport layer 226 has a transmittance of greater than 80%. In some implementations, polarized electron transport layer 226 has a thickness of less than 50 nm. Polarized electron transport layer 226 of hyperpolarization micro-magnetic resonance imager 200 is a thin film of a material that has been polarized to have a net spin polarization of electrons. This polarization can be achieved by a number of methods, such as microwave pumping, optical pumping, electrical injection, or chemical doping. The polarized electron transport layer is used to transfer the polarization of electrons from hyperpolarizer film stack 203 to imaging cell 222 via hyperpolarization of water in biological composition 224. The polarized electron transport layer can be made of a semiconductor material, such as silicon or gallium arsenide. The material is grown in a thin film on a substrate, such as a silicon wafer. The polarization of the electrons is then induced by microwave pumping, optical pumping, electrical injection, or chemical doping. The polarized electron transport layer can be a few nanometers thick. The thickness of the layer determines the efficiency of the polarization transfer. The thicker the layer, the more efficient the transfer. However, the thickness of the layer can be limited by desire to maintain a high degree of spin polarization. As the layer becomes thicker, the spin polarization may decrease due to interactions with the substrate. The polarized electron transport layer provides efficient transfer of polarization from the hyperpolarizer film stack to the imaging cell. This polarization enhances the contrast of the magnetic resonance images. The polarized electron transport layer can be a thin film of a semiconductor material. The thickness of the layer can be a few nanometers. The material can be doped with a magnetic impurity, such as phosphorus or boron, to create a net spin polarization of electrons. The polarized electron transport layer has a number of physical properties that include: spin polarization, wherein the polarized electron transport layer has a net spin polarization of electrons such that polarization can be on the order of 10%; mobility wherein the electron transport layer has a high mobility of electrons for efficient transfer of polarization from the hyperpolarizer film stack to the imaging cell; or resistivity, wherein the polarized electron transport layer has a high resistivity to prevent loss of polarization due to interactions with the substrate. The polarized electron transport layer can be made of a semiconductor material, such as silicon or gallium arsenide. The material is grown in a thin film on a substrate, such as a silicon wafer. The material is then doped with a magnetic impurity, such as phosphorus or boron, to create a net spin polarization of electrons.

In hyperpolarizer film stack 203, spin interface layer 225 is the layer of hyperpolarizer film stack 203 that is exposed to biological composition 224 in interior sample volume 237 to provide a spin-orbit interaction between layers (226, 227) and biological composition 224.

In hyperpolarization micro-magnetic resonance imager 200, ferromagnetic resonance layer 227 can include a magnetic material that has a ferromagnetic resonance with a narrow linewidth (e.g., less than 5 mT). This layer converts angular moment from the microwave field into that of mobile conduction electrons. A thickness of ferromagnetic resonance layer 227 can be selected based, e.g., on the resonance frequency of ferromagnetic resonance layer 227 and can be from 1 nm to 100 nm, specifically from 1 nm to 50 nm, and more specifically from 1 nm to 20 nm. A width W of ferromagnetic resonance layer 227 can be selected based, e.g., on the resonance frequency of ferromagnetic resonance layer 227. Moreover, ferromagnetic resonance layer 227 can be a single layer or a plurality of layers. It is contemplated that ferromagnetic resonance layer 227 is a thin film of ferromagnetic material that is used to hyperpolarize the protons in biological composition 224. Ferromagnetic resonance layer 227 can have a thickness, e.g., from 10 to 50 nanometers. The thickness of ferromagnetic resonance layer 227 can in part determine the resonant frequency of the layer. The resonant frequency of ferromagnetic resonance layer 227 is the frequency at which the layer will absorb the maximum amount of energy from the microwaves. The resonant frequency of ferromagnetic resonance layer 227 can determine the frequency of the microwaves that are used to hyperpolarize the protons in biological composition 224. Ferromagnetic resonance layer 227 can have a selected quality factor Q. Ferromagnetic resonance layer 227 can be made by depositing a thin film of ferromagnetic material on the surface of adhesion layer 228. The ferromagnetic material can be deposited by a controlled deposition process such as sputtering. The sputtering process is a process in which a material is deposited on a substrate by contacting the substrate (or adhesion layer 228) with atoms of the material that is being deposited.

In hyperpolarization micro-magnetic resonance imager 200, adhesion layer 228 can include a material that is selected to improve adhesion between ferromagnetic resonance layer 227 and substrate 229 and provides a selected growth morphology in subsequent magnetic layers. A thickness of adhesion layer 228 can be selected based, e.g., on the desired adhesion and can be from 1 nm to 100 nm, specifically from 1 nm to 10 nm, and more specifically from 1 nm to 5 nm. In some implementations, adhesion layer 228 is mechanically robust to withstand the forces applied during the fabrication process and during use. The adhesion layer can be deposited by a thin-film deposition process, such as sputtering or evaporation. The thickness of the adhesion layer is controlled by the deposition parameters, such as the deposition rate and the substrate temperature.

In hyperpolarization micro-magnetic resonance imager 200, substrate 229 is a base of hyperpolarizer film stack 203 and bottom electrode as well as forming the sealed bottom of imaging cell 222. Substrate 229 has a selected thickness and supports other layers (226, 227, 228) as well as mechanical engagement with imaging cell 222. The substrate is made of a material that is transparent to microwave radiation and is capable of withstanding the magnetic fields and temperatures generated by the imager. The substrate can be made of a material such as silicon dioxide or glass.

In hyperpolarization micro-magnetic resonance imager 200, microwave detector 204 can include a diode detector that monitors the ferromagnetic resonance of the hyperpolarizer and adjusts the microwave drive frequency to be at the resonance frequency for the operating field being used. It is contemplated that microwave detector 204 is a semiconductor device that converts microwave energy into electrical energy. It is used to detect hyperpolarizer MW transmit signal 260 from hyperpolarizer power signal 261 by microwave detector 204 and can be disposed proximate to printed circuit board with integrated shield 216 and is in electrical communication with digital control system 215. Microwave detector 204 can produce an output voltage that is proportional to the power of the microwave energy incident thereon. The output voltage of microwave detector 204 indicates the power of hyperpolarizer MW transmit signal 260.

In hyperpolarization micro-magnetic resonance imager 200, nuclear magnetic resonance tuned circuit 205 tunes nuclear magnetic resonance coil 221 to resonate at the same frequency as the proton precession frequency in imaging cell 222 and to obtain a selected impedance, e.g., 50 Ohms, so that maximum RF power is delivered to biological composition 224 in interior sample volume 237. Nuclear magnetic resonance tuned circuit 205 is a circuit that is used to tune nuclear magnetic resonance coil 221 of integrated imaging cell, hyperpolarizer, bioreactor 217 to resonate at the same frequency as the proton precession frequency of protons in imaging cell 222. Nuclear magnetic resonance tuned circuit 205 can include various circuit elements including a capacitor, an inductor, or a resistor. The capacitor can be coupled to transcoupler 210 and nuclear magnetic resonance coil 221. Nuclear magnetic resonance tuned circuit 205 can be a passive circuit element that does not require an external power source. The values of the capacitors can be chosen such that nuclear magnetic resonance tuned circuit 205 resonates at the same frequency as the proton precession frequency of protons in imaging cell 222. Nuclear magnetic resonance tuned circuit 205 is operated by applying a radio frequency (RF) signal to transcoupler 210. The RF signal is then coupled to nuclear magnetic resonance coil 221 by the capacitor. Nuclear magnetic resonance tuned circuit 205 is a compact component disposed on printed circuit board with integrated shield 216.

In hyperpolarization micro-magnetic resonance imager 200, magnet supply 206 modifies and sweeps the magnetic field to match the proton precession frequency to the NMR coil resonance and to monitor the hyperpolarizer resonance. Magnet supply 206 provides magnetic field modulation signal 251 that adjusts magnetic field 231 for performing magnetic resonance imaging of biological composition 224 in imaging cell 222. Magnet supply 206 can include various components such as a power supply, a current amplifier, a magnetic field modulation circuit, and the like. The magnetic field modulation circuit generates magnetic field modulation signal 251, which is communicated to magnet 207, wherein magnet 207 produces magnetic field 231 in response to magnetic field modulation signal 251. The magnetic field sensor 214 measures magnetic field 231 and generates magnetic sensor signal 262, which is then passed to digital control system 215 that produces magnet control signal 263 for controlling magnet supply 206.

Magnet 207 can include permanent magnets, electromagnets, a soft iron yolk, shaped pole pieces, and the like. The permanent magnet in combination with other components can produce a static magnetic field for performing magnetic resonance imaging of biological composition 224 in imaging cell 222. Magnet 207 can be disposed on or proximate to printed circuit board with integrated shield 216 and in communication with magnet supply 206 and in magnetic communication with imaging cell 222. Magnet 207 receives magnetic field modulation signal 251 from magnet supply 206, produces magnetic field 231 for performing magnetic resonance imaging of biological composition 224 in imaging cell 222, and communicates magnetic field 231 to imaging cell 222. The permanent magnet can be made of a ferromagnetic material, such as neodymium-iron-boron (NdFeB) with a selected magnetic field strength.

Magnet 207 produces a static magnetic field that ranges from 0.5 T to 1.5 T. The magnetic field strength of magnet 207 can be adjusted by changing the current flowing through magnet supply 206.

Gradient-shim coil 208 is interposed between magnet 207 and imaging cell 222 and increases field homogeneity of magnetic field 231 and provides a magnetic field gradient for nuclear magnetic resonance imaging. Gradient-shim coil 208 is connected to a power supply that provides an electrical current to the coil. The current flowing through the coil creates a magnetic field around the coil. The strength of the magnetic field is proportional to the current flowing through the coil. Gradient-shim coil 208 can create a magnetic field gradient in the imaging region. A magnetic field gradient is a variation in the strength of the magnetic field over a distance. Gradient-shim coil 208 can improve resolution of the magnetic resonance image.

NMR console 209 generates the pulse sequence by outputting RF signals, gradient signals, hyperpolarizer gates, and electrode waveforms. NMR console 209 includes a preamplifier for the receive signal (proton spin signal) and digitizes the signal that generates magnetic resonance images. NMR console 209 can be a computer-based system that includes a central processing unit (CPU), a memory, and a variety of input/output (I/O) devices. The CPU executes software that controls the imager and acquires data from it. The memory stores the software and data that are used by the CPU. The I/O devices allow NMR console 209 to communicate with the other components of the imager, such as hyperpolarizer source 201, cell controller 213, and gradient amplifiers 211. NMR console 209 can output a variety of signals, including: hyperpolarizer control signal 254, NMR transmit signal 252, and imaging cell electrode and flow control signal 255, and gradient waveform (x, y, z) 256.

Transcoupler 210 separates the outgoing transmit signal from the return receive signal going into the low noise preamp and console 209. Transcoupler 210 can be a passive electronic component that couples NMR transmit signal 252 from NMR console 209 to nuclear magnetic resonance coil 221 of integrated imaging cell, hyperpolarizer, bioreactor 217. Transcoupler 210 can be a multi-port device with ports connected to NMR console 209 and nuclear magnetic resonance coil 221. Transcoupler 210 is a broadband device that can operate over a wide range of frequencies. There are a variety of different types of transcouplers available, e.g., a lumped-element transcoupler and distributed-element transcouplers.

Gradient amplifiers 211 can be voltage to current amplifiers that take gradient waveform (x, y, z) 256 from NMR console 209 and convert them into gradient drive current 257 that drive the gradient coils. Gradient amplifiers 211 can include various circuit elements, e.g., a transformer, an inductor, a capacitor, a semiconductor device, bias tee and the like to provide an amplified signal to gradient-shim coil 208 and can be integrated circuits, discrete components, or a combination thereof.

Shim controller 212 produces low noise currents that are communicated to the gradient-shim coil 208 to improve the homogeneity of magnetic field 231 at biological composition 224. Shim controller 212 can be a circuit that generates shim current 258.

Cell controller 213 provides control lines that apply electrode bias, temperature control and read out, and flow control to integrated imaging cell, hyperpolarizer, bioreactor 217. Cell controller 213 can output a variety of control signals, including voltage, current, and temperature. Cell controller 213 receives imaging cell electrode and flow control signal 255 from NMR console 209 and produces hyperpolarizer MW transmit signal 260 based on imaging cell electrode and flow control signal 255.

Hall probe and thermometer 214 measures the magnetic field and temperature to maintain the correct environment for biological composition 224 and provides the field for the proton and electron resonance systems of hyperpolarization micro-magnetic resonance imager 200. Hall probe and thermometer 214 can be a monolithic structure, a hybrid structure, or a separate structure. The Hall probe is disposed on printed circuit board with integrated shield 216 and in electrical communication with digital control system 215. The Hall probe produces magnetic sensor signal 262 that indicates the temperature of imaging cell 222 and strength of magnetic field 231, and communicates magnetic sensor signal 262 to digital control system 215.

Digital control system 215 communicates with NMR console 209 to create electrode waveforms, control and readout temperature, readout field, and readout and control flow parameters. Digital control system 215 can include a control circuit, a plurality of digital signal processors, and a plurality of analog to digital converters to control the operation of hyperpolarization micro-magnetic resonance imager 200 and can be an integrated circuit. Digital control system 215 can be a computing device that controls certain operations of hyperpolarization micro-magnetic resonance imager 200. It receives signals from the various components, such as digital control system 215, and uses these signals to control operation of magnet 207. Digital control system 215 can receive magnet control signal 263 from digital control system 215, produce magnetic field modulation signal 251 based on magnet control signal 263, and control operation of magnet 207 with magnetic field modulation signal 251.

Printed circuit board with integrated shield 216 can be a multilayer card that includes circuits and transmission lines for hyperpolarizer film stack 203 and NMR transmit/receive system. Printed circuit board with integrated shield 216 can include mounting components for integrated imaging cell, hyperpolarizer, bioreactor 217, wiring and electronics for the electrode bias, temperature control, and flow control systems. Printed circuit board with integrated shield 216 can be a rigid printed circuit board having a ground plane and a plurality of conductive traces and mounting provisions. The conductive traces are arranged to form a circuit for communicating and interconnecting elements such as hyperpolarizer microwave signal 250, nuclear magnetic resonance tuned circuit 205, magnet 207, gradient-shim coil 208, Hall probe and thermometer 214, and integrated imaging cell, hyperpolarizer, bioreactor 217. Printed circuit board with integrated shield 216 is made of a material that is compatible with the high-frequency signals used in hyperpolarization micro-magnetic resonance imager 200.

Integrated imaging cell, hyperpolarizer, bioreactor 217 include a number of elements for containing biological composition 224 and subjecting biological composition 224 to hyperpolarization and NMR imaging with fluidic flow. Integrated imaging cell, hyperpolarizer, bioreactor 217 can include hyperpolarizer film stack 203, imaging cell 222, and nuclear magnetic resonance coil 221. Integrated imaging cell, hyperpolarizer, bioreactor 217 is disposed on printed circuit board with integrated shield 216 and in communication with hyperpolarizer transmission line 202. Imaging cell 222 includes interior sample volume 237 that can receive biological composition 224. Biological composition 224 can be a cell culture or a tissue sample. Imaging cell 222 is in close proximity to hyperpolarizer film stack 203 and can be made of a material that is transparent to microwaves. Nuclear magnetic resonance coil 221 is a coil of wire that is wrapped around imaging cell 222. Integrated imaging cell, hyperpolarizer, bioreactor 217 is operated by applying a microwave signal to hyperpolarizer film stack 203. The microwave signal causes layers in hyperpolarizer film stack 203 to hyperpolarize the protons in biological composition 224. The hyperpolarized protons are then imaged using pulsed RF sequences from nuclear magnetic resonance coil 221. Integrated imaging cell, hyperpolarizer, bioreactor 217 images biological compositions 224 with cellular resolution. Integrated imaging cell, hyperpolarizer, bioreactor 217 can be used to image a variety of biological compositions, including cell cultures, tissue samples, and whole organisms. The IICB can be used to study a variety of biological processes, including cell signaling, gene expression, protein synthesis, and drug interactions.

Imaging cell 222 includes base fluid channel 218. Base fluid channel 218 can be a capillary for introducing or for removing fluid into imaging cell 222. That is, base fluid channel 218 can be a fluidic channel that provides a fluidic pathway for biological composition 224 to flow through imaging cell 222. Biological composition 224 can be a liquid that includes water or as a medium for the diffusion of hyperpolarized protons into the biological sample disposed in biological composition 224. Base fluid channel 218 can be configured to have a cross-sectional area that is large enough to allow for free flow of biological composition 224. Base fluid channel 218 can be connected to a source of biological composition 224. Base fluid channel 218 can be in fluid communication with cap fluid channel 219 that receives biological composition 224 to maintain fluidic flow through interior sample volume 237. Base fluid channel 218 can play a role in thermal communication and diffusion of hyperpolarized molecules in biological composition 224. Base fluid channel 218 can be designed to provide a range of flow rates that can be controlled by a flow controller or that can be connected to a syringe for clinical usage via injection of biological composition 224. Base fluid channel 218 can be operated at biologically relevant temperatures consistent with viability of cells or at elevated temperatures or cold temperatures that do not support viability. Base fluid channel 218 can be made in a variety of different shapes and sizes, including straight, curved, or serpentine. The channel can also be made in a variety of different materials, e.g., metals, polymers, glasses, and the like. Imaging cell 222 includes cap fluid channel 219 that can be substantially similar to base fluid channel 218.

Cap electrode 220 is an electrode that in combination with hyperpolarizer film stack 203 provides electrochemical spin control of imaging cell 222. As a result adsorption of water on spin interface layer 225 of O-ring seal 223 is modulated by the potential at spin interface layer 225 relative to cap electrode 220. That is, cap electrode 220 creates a capacitive coupling between hyperpolarizer film stack 203 and cell cap 234. Cap electrode 220 can be made of a thin (100-200 nm) layer of metal (e.g., gold or silver deposited on a suitable substrate).

Nuclear magnetic resonance coil 221 is a wire coil that excites and detects proton spins in biological composition 224. Nuclear magnetic resonance coil 221 can be a solenoid-shaped coil that can be made of copper wire. The coil is wrapped around imaging cell 222, and it creates a field that is used to excite the protons in biological composition 224. The coil can be designed to ensure that the protons will absorb energy from the RF pulse and will be able to produce a signal that can be detected by NMR console 209. Nuclear magnetic resonance coil 221 can be made of copper wire; however, other materials, such as gold or silver, can also be used. To operate nuclear magnetic resonance coil 221, an RF pulse is applied to the coil that excites protons in biological composition 224.

Imaging cell 222 is made of biocompatible, nonconducting materials and holds biological composition 224 in interior sample volume 237 and includes nuclear magnetic resonance coil 221, electrodes (220, 225), and fluid channels (218, 219). Imaging cell 222 is a microfluidic device that contains biological composition 224 to be imaged. Imaging cell 222 is disposed on printed circuit board with integrated shield 216 and is in electrical communication with hyperpolarizer transmission line 202 and nuclear magnetic resonance tuned circuit 205, and in magnetic communication with magnet 207 and gradient-shim coil 208. Imaging cell 222 can be made from a variety of materials, including glass, plastic, ceramic, polymer, or silicon. Imaging cell 222 can be fabricated using a variety of techniques, including photolithography, etching, and molding. To operate imaging cell 222, biological composition 224 is introduced into interior sample volume 237 in magnetic field 231 of magnet 207 that is modulated by magnet supply 206. Hyperpolarizer microwave signal 250 from hyperpolarizer source 201 is applied to hyperpolarizer film stack 203 via hyperpolarizer transmission line 202. Nuclear magnetic resonance tuned circuit 205 is tuned to resonate at the same frequency as the proton precession frequency of protons in biological composition 224. Nuclear magnetic resonance coil 221 applies a radio frequency (RF) pulse to biological composition 224. The RF pulse causes the protons in biological composition 224 to precess in the magnetic field of magnet 207. The precession of the protons is detected by nuclear magnetic resonance coil 221. The detected signal is processed by digital control system 215 to produce an image of components of biological composition 224. Imaging cell 222 can be used to image a variety of material in biological composition 224, including cells, tissues, and organoids. Imaging cell 222 can be used to image biological composition 224 with cellular resolution.

Seal 223 can include leak-proof seal between cell flange 235 and hyperpolarizer film stack 203 to provide sealing against fluid leakage and can be a unitary molded part or a plurality of parts joined together. An elastomeric seal such as a polymer O-ring can be conformably interposed between cell flange 235 and hyperpolarizer film stack 203. O-ring seal 223 can be a circular gasket made of a resilient material, such as rubber or silicone. It is used to create a seal between the two surfaces. O-ring seal 223 can seal interior sample volume 237 against positive pressure leak of biological composition 224 out of interior sample volume 237 or negative pressure leak of a foreign substance (e.g., air) into interior sample volume 237 from the environment external to imaging cell 222.

Biological composition 224 is a sample of biological material that is subjected to hyperpolarized micro nuclear magnetic resonance imaging. Biological composition 224 can be any suitable type of biological tissue, such as a cell, a tissue, or organoid. The size of biological composition 224 can be on the order of the size of the volume of interior sample volume 237, base fluid channel 218, or cap fluid channel 219. Biological composition 224 is disposed in imaging cell 222 of hyperpolarization micro-magnetic resonance imager 200. Biological composition 224 can include the biological material and supporting compositional components to maintain or inhibit viability of the biological material. A suitable amount of liquid substance can be included, e.g., buffer and water to prevent the material from drying out and to produce an adequate amount of hyperpolarized water from interaction of the water with hyperpolarizer film stack 203. Biological composition 224 is hyperpolarized by hyperpolarizer film stack 203. Hyperpolarization is a process by which the spins of the protons in biological composition 224 are subject to alignment in the same direction. This alignment of the spins makes biological composition 224 more sensitive to magnetic resonance imaging. Hyperpolarized matter (e.g., water) perfuses into the biological material so that the hyperpolarized biological composition 224 is imaged by nuclear magnetic resonance coil 221. The precession of spins is detected by nuclear magnetic resonance coil 221, and the data is used to create an image of biological composition 224. The temperature of biological composition 224 is maintained at an adequate temperature by imaging cell 222.

Hyperpolarized water 230 is a form of water that has been subjected to hyperpolarization that increases the polarization of the nuclear spins of the hydrogen atoms in the water, making them more sensitive to magnetic fields. This increased sensitivity allows for the detection of much smaller amounts of water than would be possible with unpolarized water and results in improved imaging of biological composition 224 on a cellular scale. Hyperpolarized water is used in a variety of medical imaging applications, including magnetic resonance imaging (MRI) and positron emission tomography (PET). The hyperpolarization of water is achieved by exposing the water to a magnetic field and a microwave pulse. This process creates a state of high polarization, in which the majority of the hydrogen atoms have their spins aligned. The hyperpolarization of water is a transient process, and the polarization of the water will decay over time. The decay rate of the polarization depends on a number of factors, including the temperature of the water, the strength of the magnetic field, and the presence of paramagnetic impurities in the water.

Cell cap 234 is a monolithic region of imaging cell 222 or a plug that provides fluidic sealing against leakage of biological composition 224 from interior sample volume 237. Also, cap fluid channel 219 can be disposed in cell cap 234 for fluid delivery or flow of biological composition 224. Cell cap 234 can be an insert that is placed on imaging cell 222 to create a sealed environment for biological composition 224. Cell cap 234 is made of a non-magnetic material, such as glass or plastic, and has a small opening for cap fluid channel 219 that allows biological composition 224 to enter or exit biological composition 224.

Imaging cell 222 can include cell flange 235 that provides mechanical support pf components of imaging cell 222 and sealing of imaging cell 222 to hyperpolarizer film stack 203. Cell flange 235 can be a suitable material such as a metal, ceramic, polymer, glass, and the like. Cell flange 235 can be an annular member that connects imaging cell 222 to printed circuit board with integrated shield 216, e.g., by threaded holes that are used to secure cell flange 235 to printed circuit board with integrated shield 216.

Imaging cell 222 can include cell wall 236 that bounds interior sample volume 237 and can be a biocompatible material. The volume of interior sample volume 237 can be selected to hold a suitable amount of biological composition 224 that includes an adequate amount of hyperpolarizable water to produce an NMR image of biological structures in biological composition 224.

Interior sample volume 237 of hyperpolarization micro-magnetic resonance imager 200 is a small, enclosed space in which biological composition 224 is placed for imaging. The interior sample volume can be a few millimeters in diameter and a few millimeters in height. The interior sample volume is filled with biological composition 224 and provides a good thermal contact between biological composition 224 and a thermal heater or cooler disposed on printed circuit board with integrated shield 216 to regulate the temperature of biological composition 224 so that biological material in biological composition 224 remains viable if that is desired. Otherwise, biological material can be heated (e.g., for denaturing protein) or cooled to an extent that the biological material is not viable.

In hyperpolarization micro-magnetic resonance imager 200, hyperpolarizer microwave signal 250 is a microwave signal that is used to hyperpolarize a biological sample. Hyperpolarization is a process by which the magnetization of a sample is increased by applying a magnetic field and a microwave pulse. This process can be used to increase the sensitivity of magnetic resonance imaging (MRI) by orders of magnitude. The hyperpolarizer microwave signal can be generated by a microwave generator. The generator is tuned to the resonant frequency of the sample, and the microwave pulse is applied for a specific duration. The duration of the pulse can be determined by the desired degree of hyperpolarization. The hyperpolarizer microwave signal can be delivered to the sample via a waveguide. The waveguide is placed in close proximity to the sample, and the microwaves are coupled into the sample by hyperpolarizer film stack 203. The hyperpolarizer microwave signal can be used to hyperpolarize a variety of biological samples, including proteins, lipids, nucleic acids, cells, cellular features, and the like. The degree of hyperpolarization depends on the type of sample, the duration of the microwave pulse, and the temperature of the sample.

Magnetic field modulation signal 251 modulates the magnetic field of a magnet to create a desired magnetic field gradient. This gradient is involved in performing magnetic resonance imaging (MRI). Magnetic field modulation signal 251 is generated by magnet supply 206, which can include a function generator or arbitrary waveform generator. Magnetic field modulation signal 251 is sent to the magnet, which uses it to create the desired magnetic field gradient. Magnetic field modulation signal 251 can include an arbitrary waveform with a selected amplitude to control the strength of the magnetic field gradient. Magnetic field modulation signal 251 can be generated using a digital-to-analog converter (DAC).

NMR transmit signal 252 is an RF pulse that excites the protons in biological composition 224. The RF pulse is generated by NMR console 209 and is transmitted to integrated imaging cell, hyperpolarizer, bioreactor 217 via transcoupler 210. NMR transmit signal 252 has a frequency that can be equal to the proton precession frequency of the protons in biological composition 224. The amplitude of NMR transmit signal 252 is controlled by NMR console 209. The duration of NMR transmit signal 252 is also controlled by NMR console 209. The frequency of NMR transmit signal 252 can be determined by the proton precession frequency of the protons in biological composition 224. The amplitude of NMR transmit signal 252 can be determined by the desired signal-to-noise ratio of the MR image. The duration of NMR transmit signal 252 can be determined by the desired contrast of the NMR image. Various types of NMR transmit signals include rectangular pulses and sinc pulses. Rectangular pulses are square waves that have a constant amplitude and duration. Sinc pulses are bell-shaped waves that have a finite rise time and fall time.

NMR receive signal 253 is received by NMR console 209 via transcoupler 210 after biological composition 224 has been subjected to a hyperpolarization pulse from hyperpolarizer microwave signal 250 and a radio frequency excitation pulse from NMR transmit signal 252. NMR receive signal 253 is used to create an image of biological composition 224. NMR receive signal 253 is a complex signal that contains information about the spatial distribution of the protons in biological composition 224. NMR receive signal 253 is processed, e.g., by NMR console 209 to create an image of biological composition 224 although other components of hyperpolarization micro-magnetic resonance imager 200 could be used for this operation. In some embodiments, the amplitude of NMR receive signal 253 is proportional to the number of protons in biological composition 224, and the phase of NMR receive signal 253 is proportional to the spatial distribution of the protons in biological composition 224. There are a number of different types of NMR receive signals, e.g., free induction decay (FID) signal. The FID signal is the signal that is generated when biological composition 224 is subjected to a radio frequency excitation pulse. The FID signal can decay exponentially with time. Another type of NMR receive signal can be a stimulated echo signal. The stimulated echo signal is the signal that is generated when biological composition 224 is subjected to a series of radio frequency excitation pulses. The stimulated echo signal has a longer decay time than the FID signal.

Hyperpolarizer control signal 254 is a signal that is used to control the operation of hyperpolarizer source 201. Hyperpolarizer control signal 254 is generated by NMR console 209 and is sent to hyperpolarizer source 201 via a transmission line. Hyperpolarizer control signal 254 can specify the power and duration of the hyperpolarization microwave pulse for hyperpolarizer microwave signal 250 that is generated by hyperpolarizer source 201.

Imaging cell electrode and flow control signal 255 controls the flow of fluid and electrode potentials of integrated imaging cell, hyperpolarizer, bioreactor 217. The imaging cell is with electrodes (220, 225) that apply a voltage across biological composition 224 in interior sample volume 237 for adsorption and desorption of water from hyperpolarizer film stack 203 to produce hyperpolarized protons. Imaging cell electrode and flow control signal 255 can include, e.g., a voltage that controls flow of biological composition 224 in imaging cell 222. The flow control signal can be sent to a flow control valve (e.g., a solenoid valve or microfluidic flow controller) that adjusts flow of biological composition 224 through imaging cell 222.

Gradient waveform (x, y, z) 256 is a waveform that is used to modify magnetic field 231, e.g., create a gradient, homogenize magnetic field 231, or otherwise shape magnetic field 231. The gradient waveform is generated by NMR console 209 and is communicated to gradient-shim coil 208 by gradient amplifiers 211 as gradient drive current 257. Various operating parameters of gradient waveform (x, y, z) 256 are adjustable for tuning magnetic field 231, including duty cycle, rise time, fall time, and the like. Gradient waveform (x, y, z) 256 can be generated by a variety of different methods, including a digital-to-analog converter (DAC) to convert a digital signal into an analog signal.

Gradient drive current 257 is a current that is used to drive gradient-shim coil 208 to create a magnetic field gradient for spatial encoding of the NMR signal. Gradient drive current 257 is generated by gradient amplifiers 211, which amplifies a low-level control signal (e.g., gradient waveform (x, y, z) 256) from NMR console 209 to a high-level current that can drive the gradient coils. The operating parameters of the gradient drive current include the amplitude, frequency, and rise time. The amplitude of the gradient drive current can determine the strength of the magnetic field gradient. The frequency of the gradient drive current can determine the spatial resolution of the NMR image. The rise time of the gradient drive current can determine the temporal resolution of the NMR image. Various types of gradient drive currents include analog and digital.

Shim current 258 can be a small electrical current that is applied to gradient-shim coil 208 to create a magnetic field gradient that is used to improve the homogeneity of magnetic field 231 produced by magnet 207. Shim current 258 can be produced by shim controller 212. Shim current 258 can be adjusted to produce a variety of magnetic field gradients. The strength of the magnetic field gradient can be proportional to the magnitude of shim current 258. The direction of the magnetic field gradient can be determined by the polarity of shim current 258. Shim current 258 can be applied to gradient-shim coil 208 during the acquisition of magnetic resonance imaging data. Shim current 258 can be turned off during the transmission of radiofrequency pulses and the reception of magnetic resonance signals. Various types of shim currents include static shim currents and dynamic shim currents. Static shim currents can be applied to gradient-shim coil 208 continuously during the acquisition of magnetic resonance imaging data. Dynamic shim currents can be applied to gradient-shim coil 208 in pulses during the acquisition of magnetic resonance imaging data.

Electrode and flow control signals 259 are used to control production of hyperpolarization of water in biological composition 224 and flow of biological composition 224 through imaging cell 222. The electrode signals are used to apply a voltage to the electrodes in the imaging cell, which creates an electric field that polarizes the protons in the biological composition. The flow control signals are used to control the flow of liquid through the imaging cell, which allows for the continuous replenishment of the biological composition and the removal of waste products. The electrode and flow control signals are generated by cell controller 213 and are communicated to integrated imaging cell, hyperpolarizer, bioreactor 217 via a transmission line. The electrode signals can be generated by a pulse generator in cell controller 213, and the flow control signals can be generated by a digital-to-analog converter (DAC) in cell controller 213 or similar generators.

Hyperpolarizer MW transmit signal 260 is a microwave signal that is used to diagnose an extent of hyperpolarization of biological composition 224. Hyperpolarizer MW transmit signal 260 is transmitted from integrated imaging cell, hyperpolarizer, bioreactor 217 in response to transmission of hyperpolarizer microwave signal 250 from hyperpolarizer source 201 to integrated imaging cell, hyperpolarizer, bioreactor 217 via hyperpolarizer transmission line 202. Hyperpolarizer MW transmit signal 260 is received by microwave detector 204 that measures a power in hyperpolarizer MW transmit signal 260 and produces hyperpolarizer power signal 261 that indicates this power.

Hyperpolarizer power signal 261 is a signal that indicates a power of hyperpolarizer MW transmit signal 260 and is received by digital control system 215 that generates magnet control signal 263 based on hyperpolarizer power signal 261 and other inputs, e.g., magnetic sensor signal 262.

Magnetic sensor signal 262 is produced by Hall probe and thermometer 214 disposed on printed circuit board with integrated shield 216. Hall probe and thermometer 214 measures magnetic field 231 and temperature of imaging cell 222, and produces magnetic sensor signal 262 that indicates the temperature of imaging cell 222 and strength of magnetic field 231. Magnetic sensor signal 262 is received by digital control system 215 that generates magnet control signal 263 based on hyperpolarizer power signal 261 and other inputs, e.g., magnetic sensor signal 262.

Magnet control signal 263 is a digital signal that is used to control magnetic field 231 produced by magnet 207 in hyperpolarization micro-magnetic resonance imager 200. Magnet control signal 263 is generated by magnet supply 206 and is sent to magnet 207 via a transmission line.

Figure 10:
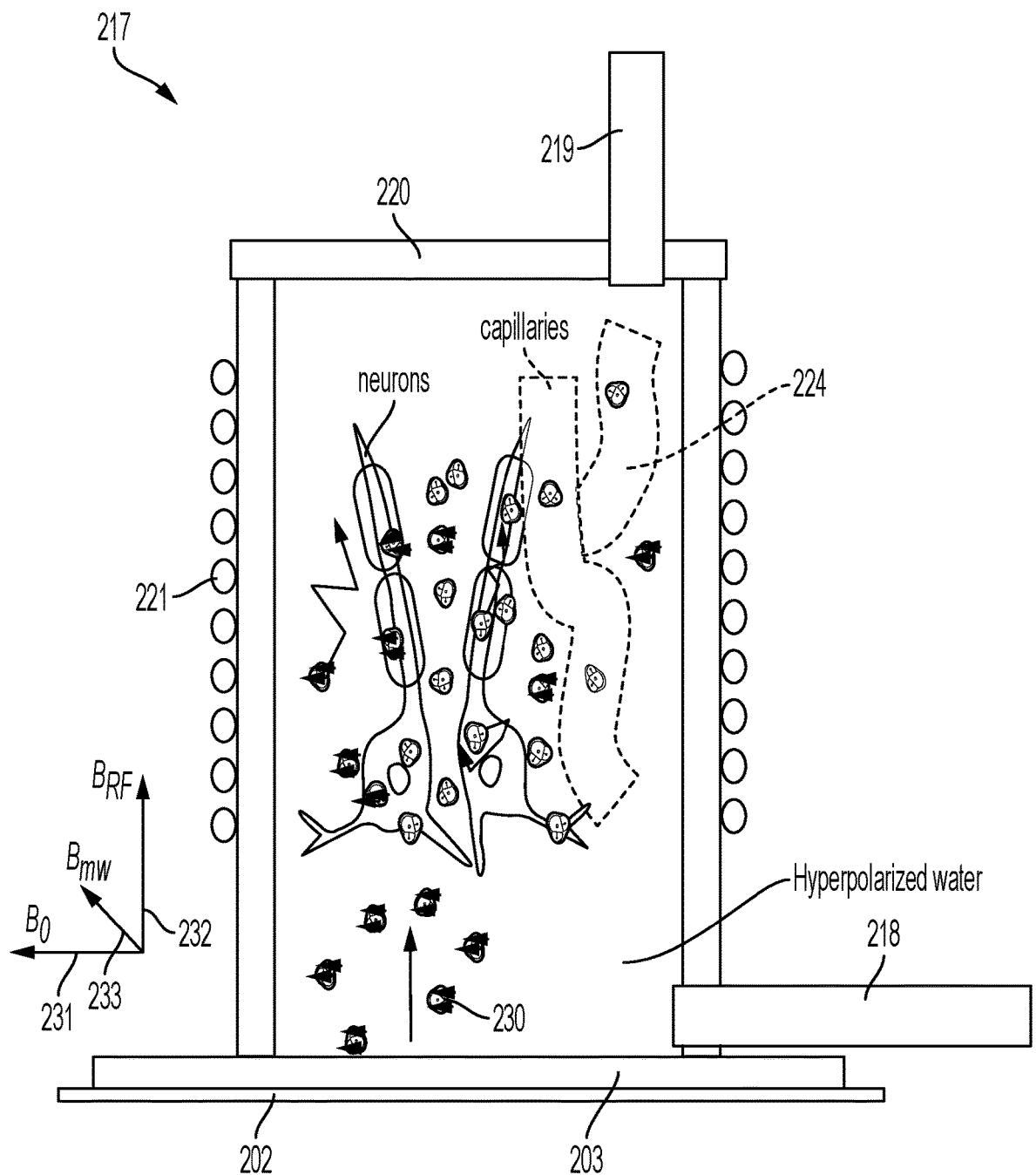
FIG. 10 shows, according to some embodiments, an integrated imaging cell, hyperpolarizer, bioreactor 217.

In an embodiment, hyperpolarization micro-magnetic resonance imager 200 uses a novel method to hyperpolarize water to enhance signal and contrast, enabling imaging of small biological structures, e.g., disposed in biological composition 224. With reference to FIG. 1, hyperpolarization micro-magnetic resonance imager 200 can include magnet 207, gradient-shim coil 208, a small (e.g., about 3 mm) imaging cell 222 with an integrated hyperpolarizer film stack 203 that uses integrated imaging cell, hyperpolarizer, bioreactor 217 with hyperpolarizer source 201 as a microwave drive circuit, an integrated nuclear magnetic resonance (NMR) nuclear magnetic resonance coil 221 (for RF transmit/receive), nuclear magnetic resonance tuned circuit 205, sample cell bias circuits (cap electrode 220, hyperpolarizer film stack 203), and flow perfusion components (base fluid channel 218, cap fluid channel 219). Hyperpolarization micro-magnetic resonance imager 200 is configured so that magnetic field 231, NMR radiofrequency field 232, and hyperpolarizer microwave field 233 are mutually orthogonal as shown in FIG. 10. Hyperpolarization micro-magnetic resonance imager 200 hyperpolarizes water protons at spin interface layer 225 (a film/water interface) and then can uses electrochemical modulation and flow to perfuse the hyperpolarized water through adjacent biological composition 224.

Advantageously, hyperpolarization micro-magnetic resonance imager 200 uses solid state ferromagnetic resonance induced by microwave radiation driven though an adjacent hyperpolarizer transmission line 202 (e.g., a coplanar waveguide). Ferromagnetic resonance layer 227 is one of several layers in hyperpolarizer film stack 203 that can highly polarize and manipulate electron spins using spintronic technologies including spin pumping. Hyperpolarizer film stack 203 is a thin film stack that can include adhesion layer 228, ferromagnetic resonance layer 227 with a narrow resonance linewidth, polarized electron transport layer 226, and spin interface layer 225. In an embodiment, a 10 mm diameter insulating substrate 229, such as glass or sapphire, is used with thickness that can be nanometers to less than 0.2 mm to provide a large microwave amplitude at the sample interface. The electron-proton spin transfer layer and polarization chemistry provide benefits to enhance hyperpolarization by hyperpolarizer film stack 203. Moreover, hyperpolarizer film stack 203 is used as the base electrode to modulate water bonding and interfacial spin transfer in integrated imaging cell, hyperpolarizer, bioreactor 217.

Hyperpolarizer film stack 203 can operate at low fields (100 mT to 200 mT) and microwave frequencies (8 GHz to 15 GHz) so that hyperpolarization micro-magnetic resonance imager 200 can be compact and inexpensive.

Numerous components of hyperpolarization micro-magnetic resonance imager 200 can be integrated on printed circuit board with integrated shield 216 allowing for easy parallelization and inexpensive production. Printed circuit board with integrated shield 216 includes RF components (nuclear magnetic resonance tuned circuit 205) for the NMR cell, the microwave components for hyperpolarizer film stack 203, cell bias electrodes (220, 203) and circuitry, field and temperature monitoring (cell controller 213) and adjusting circuitry.

Hyperpolarization micro-magnetic resonance imager 200 include integrated imaging cell, hyperpolarizer, bioreactor 217 with temperature control and perfusion with imaging cell 222 so biological cells can remain viable and grow during an extended imaging process. Imaging cell 222 is configured to receive standard biopsy needles for quick and efficient transfer of tissue samples.

Hyperpolarization micro-magnetic resonance imager 200 can uses electrochemical cell biasing techniques (via cell controller 213) integrated with the pulse sequence to control and enhance electron-proton spin transfer.

Hyperpolarization micro-magnetic resonance imager 200 can use perfused hyperpolarized water to enhance cell contrast without the addition of foreign agents.

Hyperpolarization micro-magnetic resonance imager 200 can be made in various ways. It should be appreciated that hyperpolarization micro-magnetic resonance imager 200 includes a number of optical, electrical, or mechanical components, wherein such components can be interconnected and placed in communication (e.g., optical communication, electrical communication, mechanical communication, and the like) by physical, chemical, optical, or free-space interconnects. The components can be disposed on mounts that can be disposed on a bulkhead for alignment or physical compartmentalization. As a result, hyperpolarization micro-magnetic resonance imager 200 can be disposed in a terrestrial environment or space environment. Elements of hyperpolarization micro-magnetic resonance imager 200 can be formed from suitable materials, such as ceramic, glass, polymers, or metal. According to an embodiment, the elements of hyperpolarization micro-magnetic resonance imager 200 are formed using 3D printing although the elements of hyperpolarization micro-magnetic resonance imager 200 can be formed using other methods, such as injection molding or machining a stock material such as block of material that is subjected to removal of material such as by cutting, laser oblation, and the like. Accordingly, hyperpolarization micro-magnetic resonance imager 200 can be made by additive or subtractive manufacturing. In an embodiment, elements of hyperpolarization micro-magnetic resonance imager 200 are selectively etched to remove various different materials using different etchants and photolithographic masks and procedures. The various layers thus formed can be subjected to joining by bonding to form hyperpolarization micro-magnetic resonance imager 200.

In making hyperpolarizer film stack 203, hyperpolarizer film stack 203 can be fabricated using sputter or e-beam deposition of multiple layers. The initial layer is an adhesion/templating layer that may be Ta or Ti. The next layer can be a ferromagnetic layer that supports ferromagnetic resonance with a narrow linewidth. This layer can be, e.g., NiFe, CoFeB, or another magnetic soft material. The next layers are for electron spin transport and for interfacing with biological composition 224. These materials can include Pt, Ru, Ti, NiO, or various other magnetic oxides. The thin films can have a thickness from 10 nm to 100 nm. The magnetic layers are thin and extend beyond imaging cell 222 to reduce the effect of hyperpolarizer induced magnetic fields. The substrate can be 10 mm glass or sapphire disks. The top source of hyperpolarizer film stack 203 serves as the bottom electrode of integrated imaging cell, hyperpolarizer, bioreactor 217 and makes electrical contact with a bias voltage contact. The film/substrate is sealed, e.g., with an O-ring, to form a leak-proof container for biological composition 224.

In making printed circuit board with integrated shield 216, printed circuit board with integrated shield 216 can include multiple layers, e.g., up to 4 layers, and has the microwave co-planar wave guide, the NMR resonance circuit, heaters, thermometers, Hall probes, and any additional control circuitry. The NMR, microwave, and bias control connectors can be nonmagnetic SMA connectors that support frequencies up to 26 GHz. The printed circuit board also contains holes for securing and aligning the imaging cell and hyperpolarization stack. The circuit board is designed to fit into a metal enclosure that provides shielding from noise. The enclosure mates to the electrical and fluid lines interfacing with the printed circuit board.

The tune and match circuit includes several capacitors and the NMR transmit and receive coil. This circuit operates so that the resonant frequency matches that of precessing protons in the desired operation field.

The magnet assembly includes various permanent magnets, soft iron yokes that contain and direct the field, and shaped soft iron or NiFe pole pieces for improving field homogeneity. The magnet assembly can be designed using finite element analysis and optimized for field homogeneity.

Planar gradient and shim coils are designed and fabricated using printed circuit board techniques. NMR console 209 can be a commercial or custom NMR console. The imaging cell along with the top cover can be machined from a biocompatible material such as polytetrafluoroethylene (commercially available under the tradename TEFLON) or polyphenylene sulfide. The NMR coil is wound around the imaging cell to obtain the desired inductance and signal sensitivity. Custom control software provides integration of the NMR pulse sequence with the hyperpolarizer, flow, and electrode signals. The software can include standard packages for image reconstruction and display.

Hyperpolarization micro-magnetic resonance imager 200 has numerous advantageous and unexpected benefits and uses. In an embodiment, a process for three-dimensional imaging of biological composition 224 with cellular resolution with hyperpolarization micro-magnetic resonance imager 200 includes: providing biological composition 224 to be imaged; disposing biological composition 224 in imaging cell 222 of integrated imaging cell, hyperpolarizer, bioreactor 217; receiving hyperpolarizer control signal 254 from NMR console 209; producing hyperpolarizer microwave signal 250 from hyperpolarizer control signal 254; communicating hyperpolarizer microwave signal 250 to integrated imaging cell, hyperpolarizer, bioreactor 217 via hyperpolarizer transmission line 202; producing magnetic field 231 for performing magnetic resonance imaging of biological composition 224 in imaging cell 222; communicating magnetic field 231 to imaging cell 222; measuring magnetic field 231 and temperature of imaging cell 222; producing magnetic sensor signal 262 that indicates the temperature of imaging cell 222 and strength of magnetic field 231; adjusting the strength of magnetic field 231 based on magnetic sensor signal 262; and receiving a magnetic resonance signal 260 from integrated imaging cell, hyperpolarizer, bioreactor 217. Thereafter, hyperpolarizer MW transmit signal 260 is subjected to analyze to construct an image of biological structures in biological composition 224.

In an embodiment for three-dimensional imaging of a biological composition with cellular resolution, the biological composition to be imaged can be any biological sample of interest, such as a cell culture, tissue, or organoid. In disposing biological composition 224 in imaging cell 222, the imaging cell can be a small chamber that contains the biological composition and is subjected to a magnetic field. In receiving a hyperpolarizer control signal from the NMR console, the NMR console is a computing device that controls the hyperpolarization process. In producing a hyperpolarizer microwave signal from the hyperpolarizer control signal, the hyperpolarizer microwave signal is used to excite the protons in the biological composition, causing them to become polarized. In communicating the hyperpolarizer microwave signal to the imaging cell via a hyperpolarizer transmission line, the hyperpolarizer transmission line is a waveguide that carries the hyperpolarizer microwave signal to the imaging cell. In producing a magnetic field for performing magnetic resonance imaging of the biological composition in the imaging cell, the magnetic field is used to align the polarized protons in the biological composition. In measuring the magnetic field and temperature of the imaging cell, the magnetic field and temperature of the imaging cell are measured using a magnetic sensor. In producing a magnetic sensor signal that indicates the temperature of the imaging cell and strength of magnetic field, the magnetic sensor signal is produced by the magnetic sensor and is used to monitor the magnetic field and temperature of the imaging cell.

In an embodiment, three-dimensional imaging of a biological composition with cellular resolution includes installing desired hyperpolarization film stack, ensuring electronics are on and functioning; obtaining a biological sample from a biopsy or from an organoid; inject biological composition 224 that includes the biological sample into imaging cell 222; closing imaging cell 222; ensuring electrodes and capillaries are in place; reinstalling shield closure; loading biological composition 224 into magnet assembly; ensuring RF, microwave, and control cables are attached; setting the field to obtain an NMR signal; shimming the field to maximize the signal; obtaining a ferromagnetic resonance peak by scanning the frequency at the current magnetic field value; setting the hyperpolarizer frequency to the maximum of the resonance; tuning the hyperpolarizer frequency and amplitude to maximize signal enhancement; running a selected imaging pulse sequence; acquiring image data; and reconstructing and analyzing the image.

In an embodiment, hyperpolarization micro-magnetic resonance imager 200 and three-dimensional imaging of a biological composition with cellular resolution can include the properties, functionality, hardware, and process steps described herein and embodied in any of the following non-exhaustive list:

- a process (e.g., a computer-implemented method including various steps; or a method carried out by a computer including various steps);
- an apparatus, device, or system (e.g., a data processing apparatus, device, or system including means for carrying out such various steps of the process; a data processing apparatus, device, or system including means for carrying out various steps; a data processing apparatus, device, or system including a processor adapted to or configured to perform such various steps of the process);
- a computer program product (e.g., a computer program product including instructions which, when the program is executed by a computer, cause the computer to carry out such various steps of the process; a computer program product including instructions which, when the program is executed by a computer, cause the computer to carry out various steps);
- a computer-readable storage medium or data carrier (e.g., a computer-readable storage medium including instructions which, when executed by a computer, cause the computer to carry out such various steps of the process; a computer-readable storage medium including instructions which, when executed by a computer, cause the computer to carry out various steps; a computer-readable data carrier having stored thereon the computer program product; a data carrier signal carrying the computer program product); a computer program product including comprising instructions which, when the program is executed by a first computer, cause the first computer to encode data by performing certain steps and to transmit the encoded data to a second computer; or
- a computer program product including instructions which, when the program is executed by a second computer, cause the second computer to receive encoded data from a first computer and decode the received data by performing certain steps.

Figure 14:
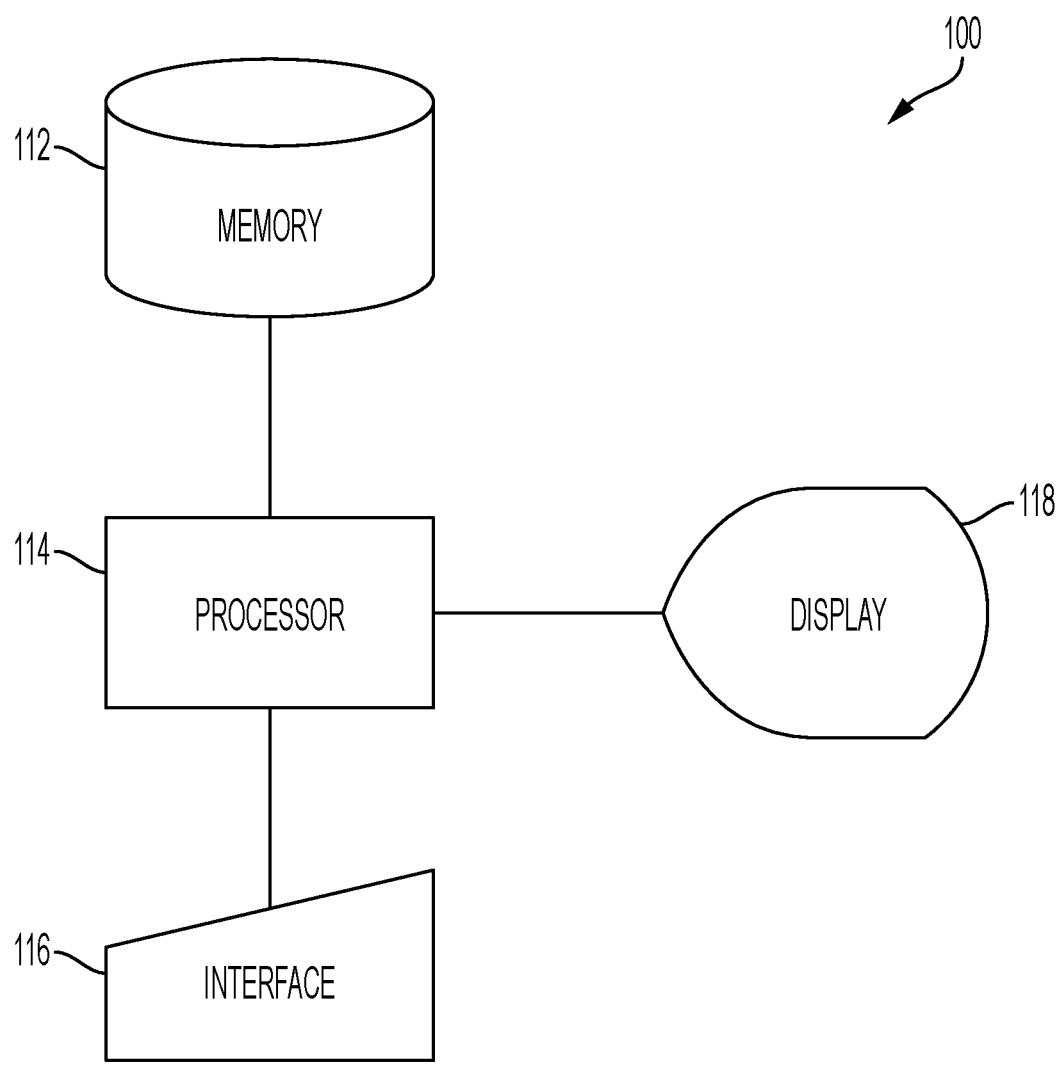
FIG. 14 shows, according to some embodiments, shows a computer system.

It should be understood that the calculations may be performed by any suitable computer system, such as that diagrammatically shown in FIG. 14. Data is entered into system 100 via any suitable type of user interface 116, and may be stored in memory 112, which may be any suitable type of computer readable and programmable memory and is preferably a non-transitory, computer readable storage medium. Calculations are performed by processor 114, which may be any suitable type of computer processor and may be displayed to the user on display 118, which may be any suitable type of computer display.

Processor 114 may be associated with, or incorporated into, any suitable type of computing device, for example, a personal computer or a programmable logic controller. The display 118, the processor 114, the memory 112 and any associated computer readable recording media are in communication with one another by any suitable type of data bus, as is well known in the art.

Examples of computer-readable recording media include non-transitory storage media, a magnetic recording apparatus, an optical disk, a magneto-optical disk, and/or a semiconductor memory (for example, RAM, ROM, etc.). Examples of magnetic recording apparatus that may be used in addition to memory 112, or in place of memory 112, include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. It should be understood that non-transitory computer-readable media include all computer-readable media except for a transitory, propagating signal.

Hyperpolarization micro-magnetic resonance imager 200 can be used, e.g. in the field of biological imaging. It offers several advantages over conventional NMR, including higher resolution, improved contrast, and reduced scan times. Hyperpolarization micro-magnetic resonance imager 200 allows for much higher resolution images than conventional NMR. Another advantage of hyperpolarization micro-magnetic resonance imager 200 is that it provides improved contrast. Hyperpolarization micro-magnetic resonance imager 200 can also reduce scan times because hyperpolarized nuclei produce a stronger signal than non-hyperpolarized nuclei so that less time is involved in collection of adequate signal to create an image. In addition to the advantages listed above, hyperpolarization micro-magnetic resonance imager 200 also can be used for a variety of other applications, such as preclinical research, drug discovery, and environmental monitoring. For example, hyperpolarization micro-magnetic resonance imager 200 could be used to study the effects of new drugs on living tissue in real time. This would allow researchers to identify potential side effects and toxicity much earlier in the drug development process. Additionally, hyperpolarization micro-magnetic resonance imager 200 could be used to monitor the levels of pollutants in the environment. This would help to identify areas that are at risk of contamination and to track the progress of cleanup efforts.

Conventional NMR and magnetic resonance imaging (MRI) technology have several limitations, including: low signal-to-noise ratio (SNR) that can make it difficult to image small structures or those with low contrast; long acquisition times that can make scans uncomfortable for patients and can limit their use in clinical settings; limited spatial resolution that can make it difficult to image small structures or those with fine detail.

Hyperpolarization micro-magnetic resonance imager 200 can be used in pathology for rapid imaging of cell biopsies and for precision medicine where patient derived organoids are grown and characterized to determine response to potential therapies. Hyperpolarization micro-magnetic resonance imager 200 can be compact, inexpensive, and provides 3-dimensional imaging that is faster with potentially more information content than conventional histology tools based on optical microscopy. Hyperpolarization micro-magnetic resonance imager 200 can include a compact permanent magnet assembly, integrated RF, microwave, field gradient, bioreactor control circuitry, and field programmable gate array (FPGA) control system provides a similar size and cost of optical microscopy systems, and provides more 3-dimensional information, is less invasive and destructive, and provides more rapid information due to not requiring extensive sample preparation.

Hyperpolarization micro-magnetic resonance imager 200 overcomes these limitations in part by using hyperpolarization to increase the SNR of the NMR signal.

Example

The articles and processes herein are illustrated further by the following Example, which is non-limiting.

Figure 4:
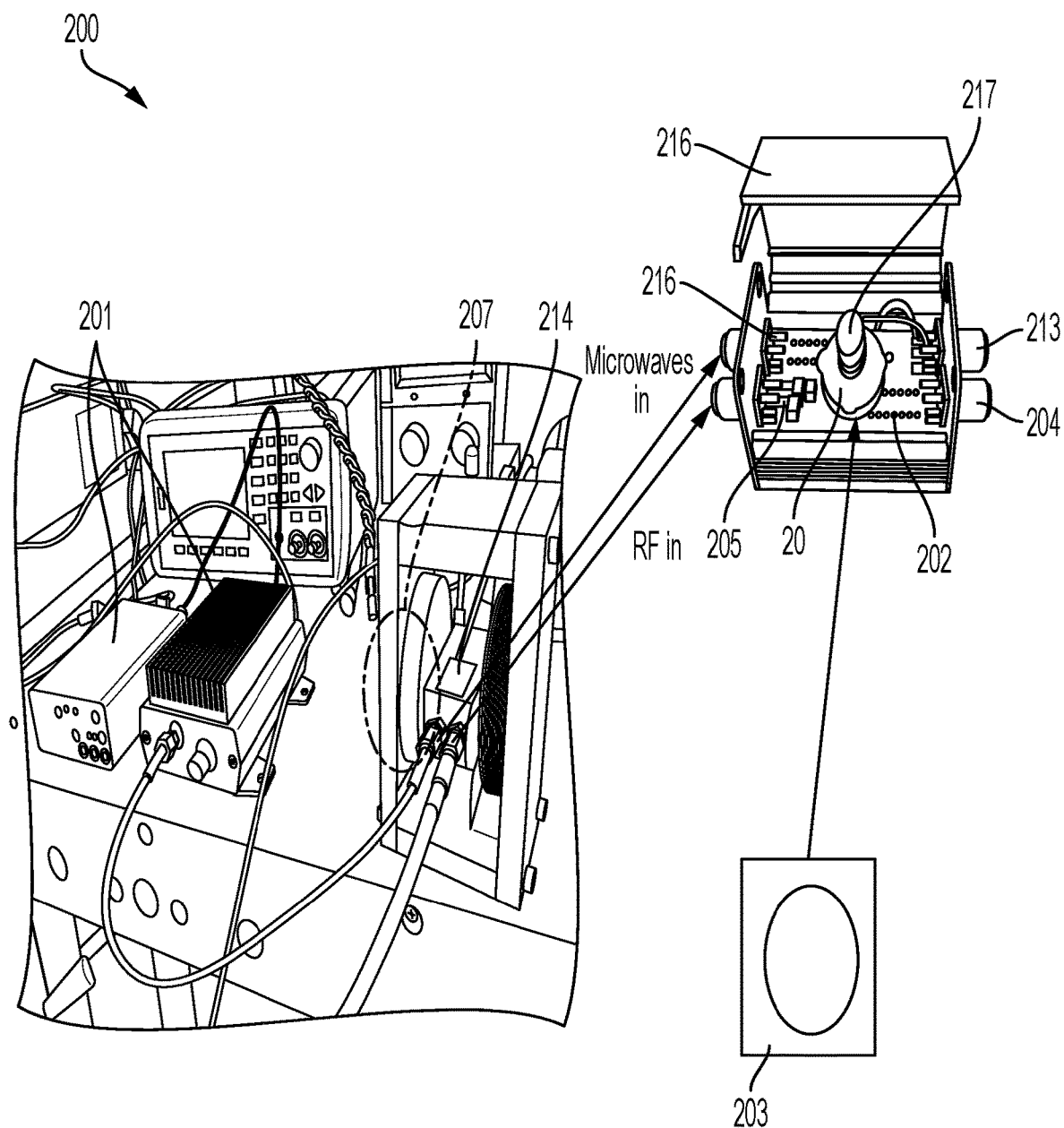
FIG. 4 shows, according to some embodiments, a hyperpolarization micro-magnetic resonance imager 200.
Figure 5:
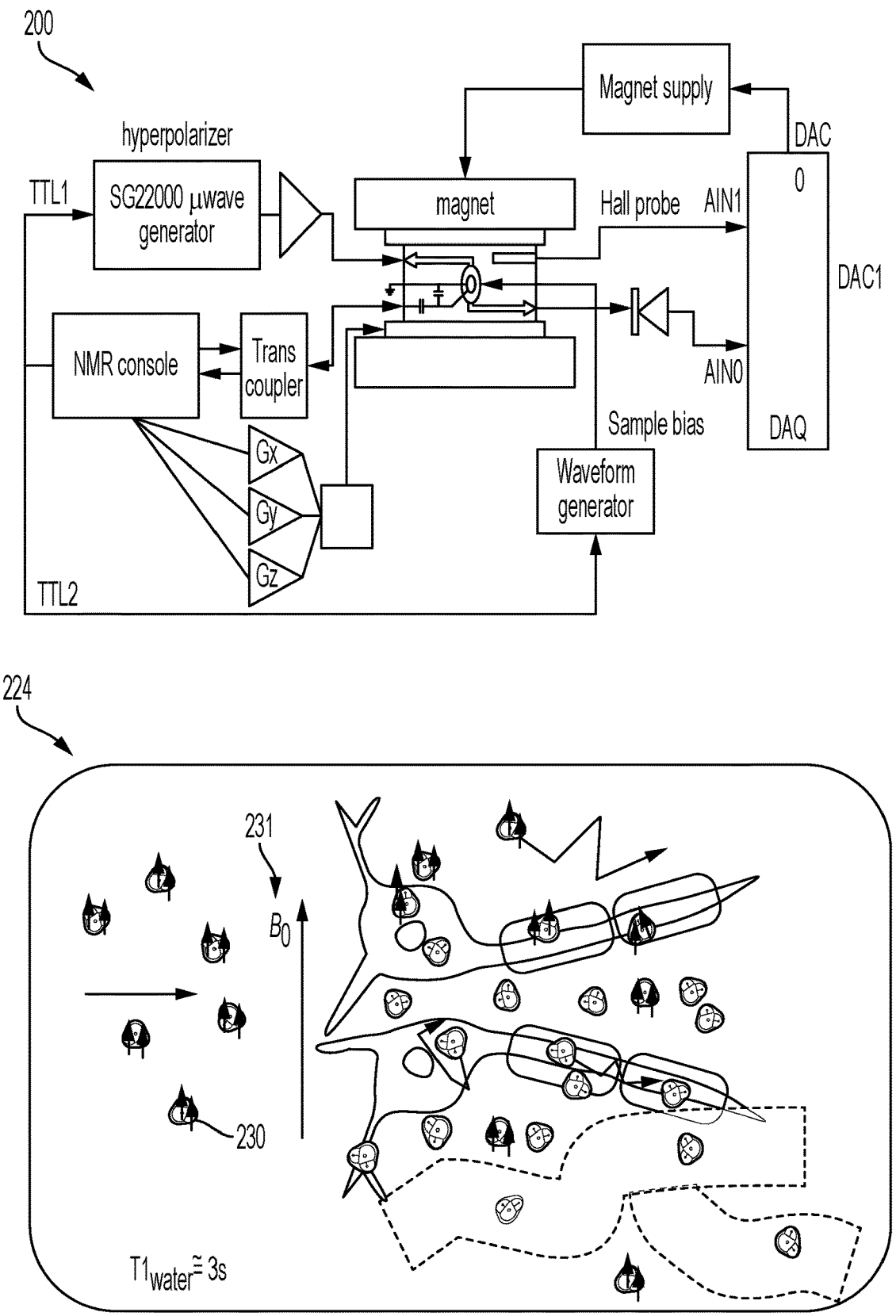
FIG. 5 shows, according to some embodiments, a hyperpolarization micro-magnetic resonance imager 200 (top panel) and a biological composition 224 (lower panel).
Figure 6:
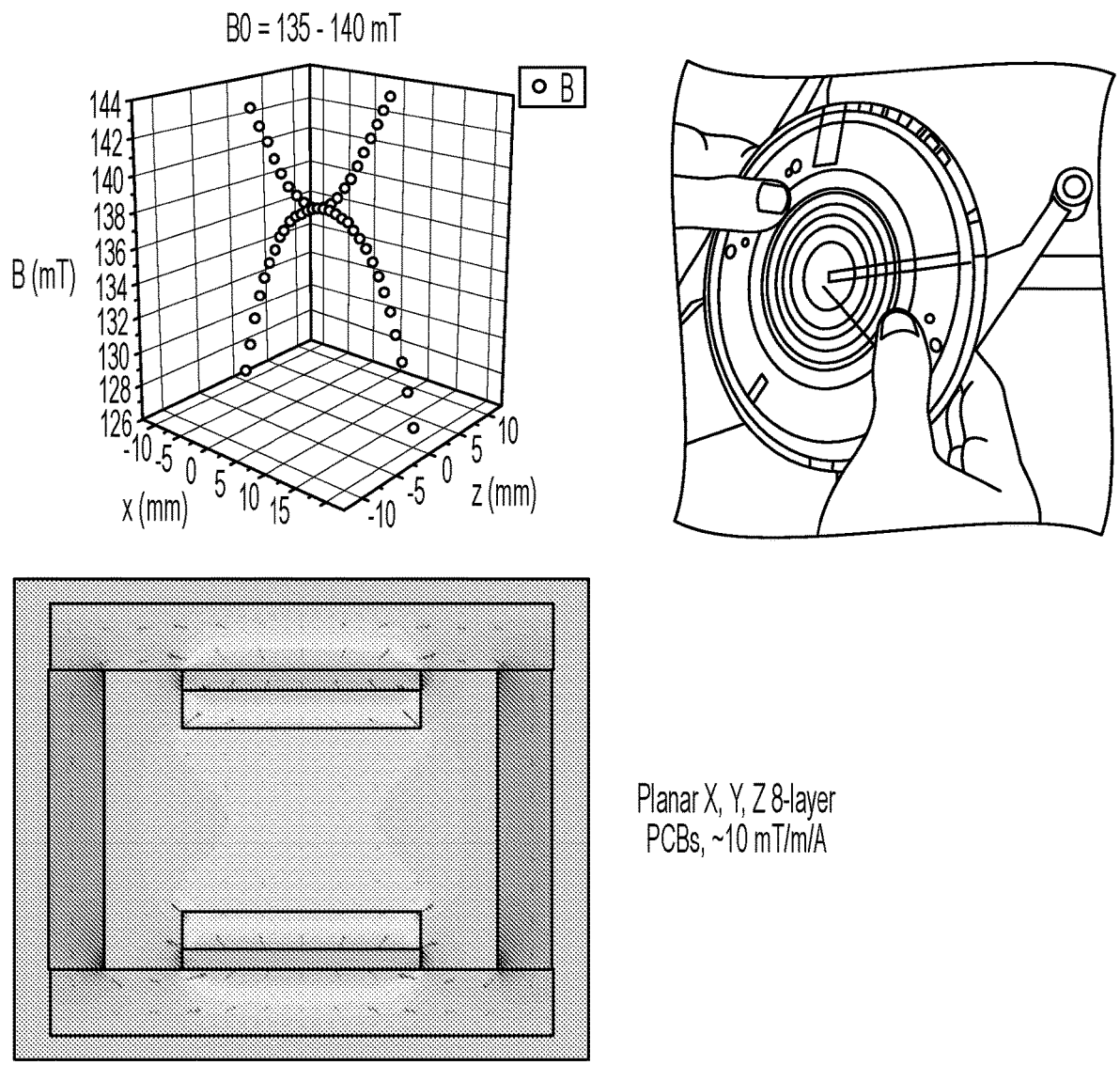
FIG. 6 shows, according to some embodiments, aspects of magnets for hyperpolarization micro-magnetic resonance imager 200.

With reference to FIG. 4, hyperpolarization micro-magnetic resonance imager 200 for three-dimensional imaging of a biological composition 224 with cellular resolution includes: hyperpolarizer source 201 in electrical communication with 202 and in electrical communication with 209 and in electrical communication with 217 and that receives hyperpolarizer control signal 254 from NMR console 209, produces hyperpolarizer microwave signal 250 from hyperpolarizer control signal 254, and communicates hyperpolarizer microwave signal 250 to integrated imaging cell, hyperpolarizer, bioreactor 217 via hyperpolarizer transmission line 202; hyperpolarizer transmission line 202 disposed on printed circuit board with integrated shield 216 and in electrical communication with hyperpolarizer source 201 and in electrical communication with integrated imaging cell and that receives hyperpolarizer microwave signal 250 from hyperpolarizer source 201 and communicates hyperpolarizer microwave signal 250 to integrated imaging cell, hyperpolarizer, bioreactor 217; nuclear magnetic resonance tuned circuit 205 disposed on printed circuit board with integrated shield 216 and in electrical communication with transcoupler 210 and in electrical communication with integrated imaging cell and that capacitively coupled to transcoupler 210 and nuclear magnetic resonance coil 221 of integrated imaging cell, hyperpolarizer, bioreactor 217, and tunes nuclear magnetic resonance coil 221 to resonate at the same frequency as the proton precession frequency of protons in imaging cell 222, and provides an impedance so that a maximum RF power is delivered to biological composition 224 disposed in imaging cell 222; magnet 207 disposed on printed circuit board with integrated shield 216 and in electrical communication with magnet supply 206 and in magnetic communication with imaging cell 222 and that receives magnetic field modulation signal 251 from magnet supply 206, produces magnetic field 231 for performing magnetic resonance imaging of biological composition 224 in imaging cell 222, and communicates magnetic field 231 to imaging cell 222; gradient-shim coil 208 disposed on printed circuit board with integrated shield 216 and in magnetic communication with magnet 207 and in magnetic communication with imaging cell 222 and that is interposed between magnet 207 and imaging cell 222 and that increases homogeneity of magnetic field 231 and provides a magnetic field gradient for nuclear magnetic resonance imaging; Hall probe and thermometer 214 disposed on printed circuit board with integrated shield 216 and in electrical communication with digital control system 215 and that measure magnetic field 231 and temperature of imaging cell 222, produces magnetic sensor signal 262 that indicates the temperature of imaging cell 222 and strength of magnetic field 231, and communicates magnetic sensor signal 262 to digital control system 215; printed circuit board with integrated shield 216 in mechanical communication with hyperpolarizer transmission line 202 and in mechanical communication with integrated imaging cell and in mechanical communication with hyperpolarizer and in mechanical communication with bioreactor 217 and that such that hyperpolarizer transmission line 202, integrated imaging cell, hyperpolarizer, bioreactor 217, and nuclear magnetic resonance tuned circuit 205 are disposed and arranged on printed circuit board with integrated shield 216, such that integrated imaging cell, hyperpolarizer, bioreactor 217 and Hall probe and thermometer 214 are interposed between a pair of magnet 207 and a pair of gradient-shim coil 208; and integrated imaging cell, hyperpolarizer, bioreactor 217 disposed on printed circuit board with integrated shield 216 and disposed on hyperpolarizer transmission line 202 and in mechanical communication with printed circuit board with integrated shield 216 and in mechanical communication with hyperpolarizer transmission line 202 and that comprises hyperpolarizer film stack 203, imaging cell 222, and nuclear magnetic resonance coil 221.

Figure 7:
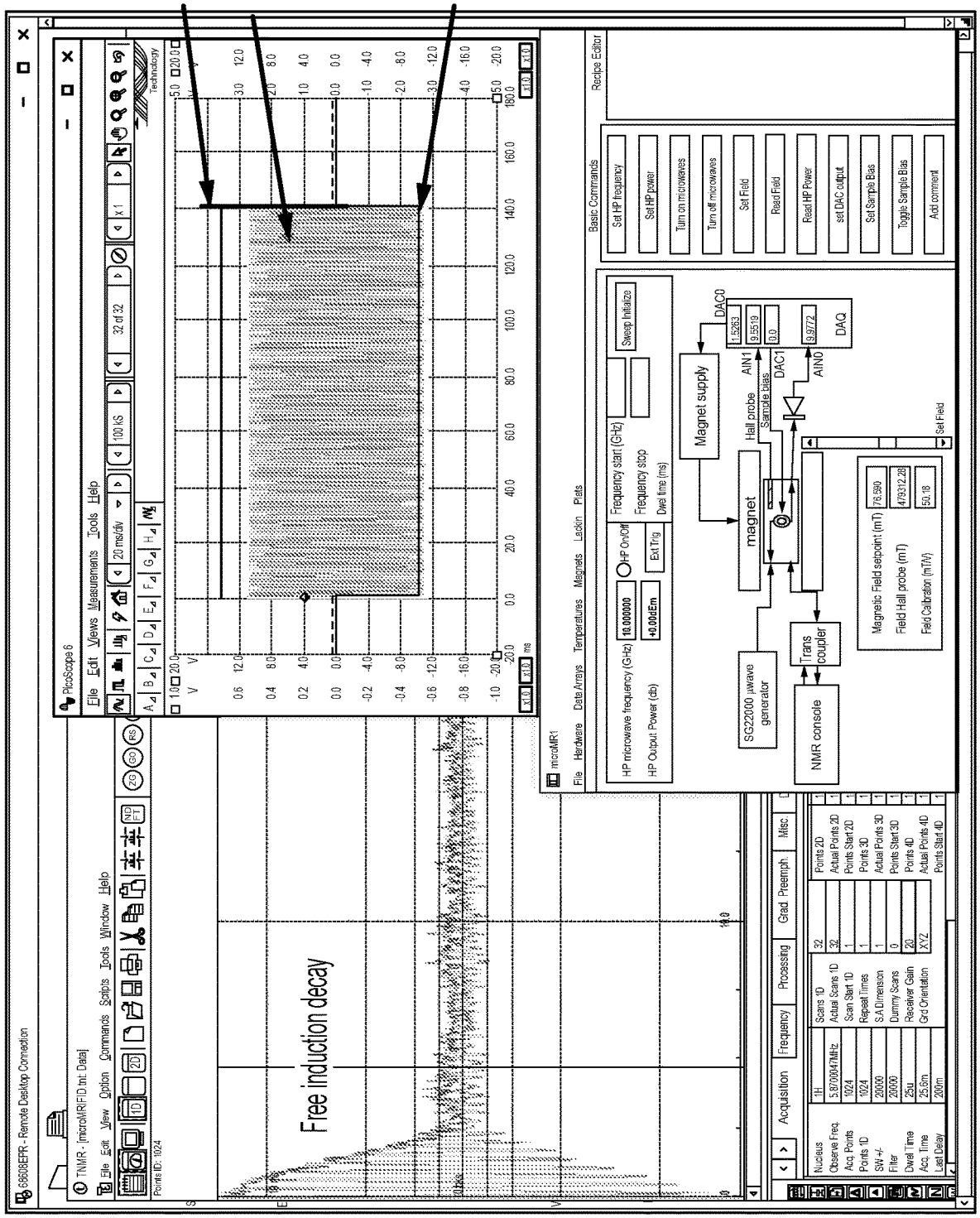
FIG. 7 shows, according to some embodiments, data acquisition for a hyperpolarization micro-magnetic resonance imager 200.
Figure 8:
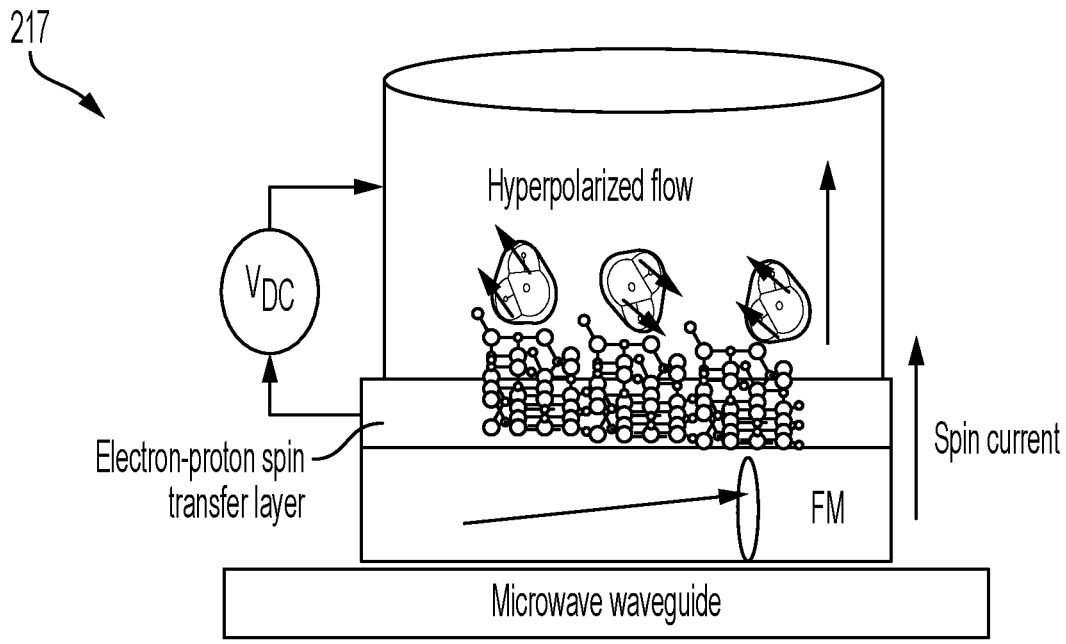
FIG. 8 shows, according to some embodiments, spintronic hyperpolarization for an integrated imaging cell, hyperpolarizer, bioreactor 217.
Figure 9:
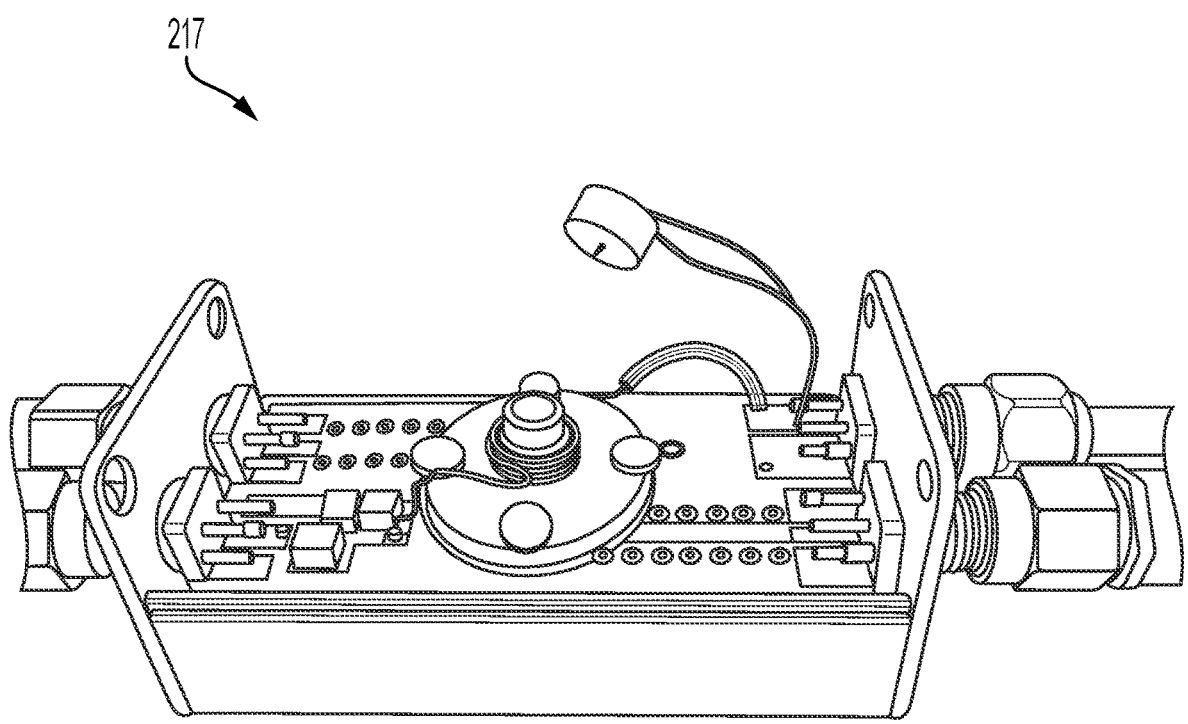
FIG. 9 shows, according to some embodiments, an integrated imaging cell, hyperpolarizer, bioreactor 217.
Figure 11:
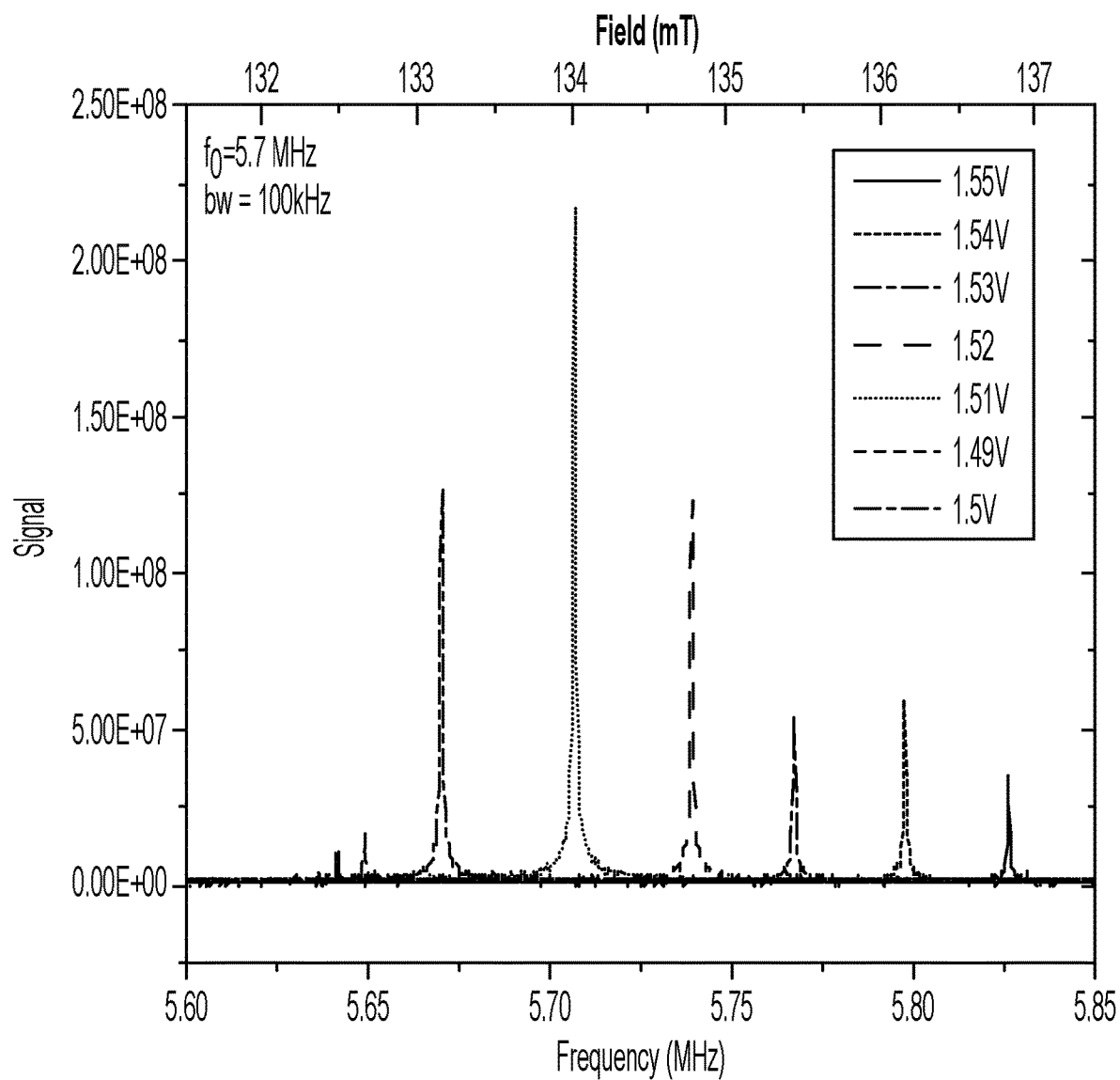
FIG. 11 shows, according to some embodiments, a graph of signal versus frequency of for data acquired by a hyperpolarization micro-magnetic resonance imager 200.
Figure 12:
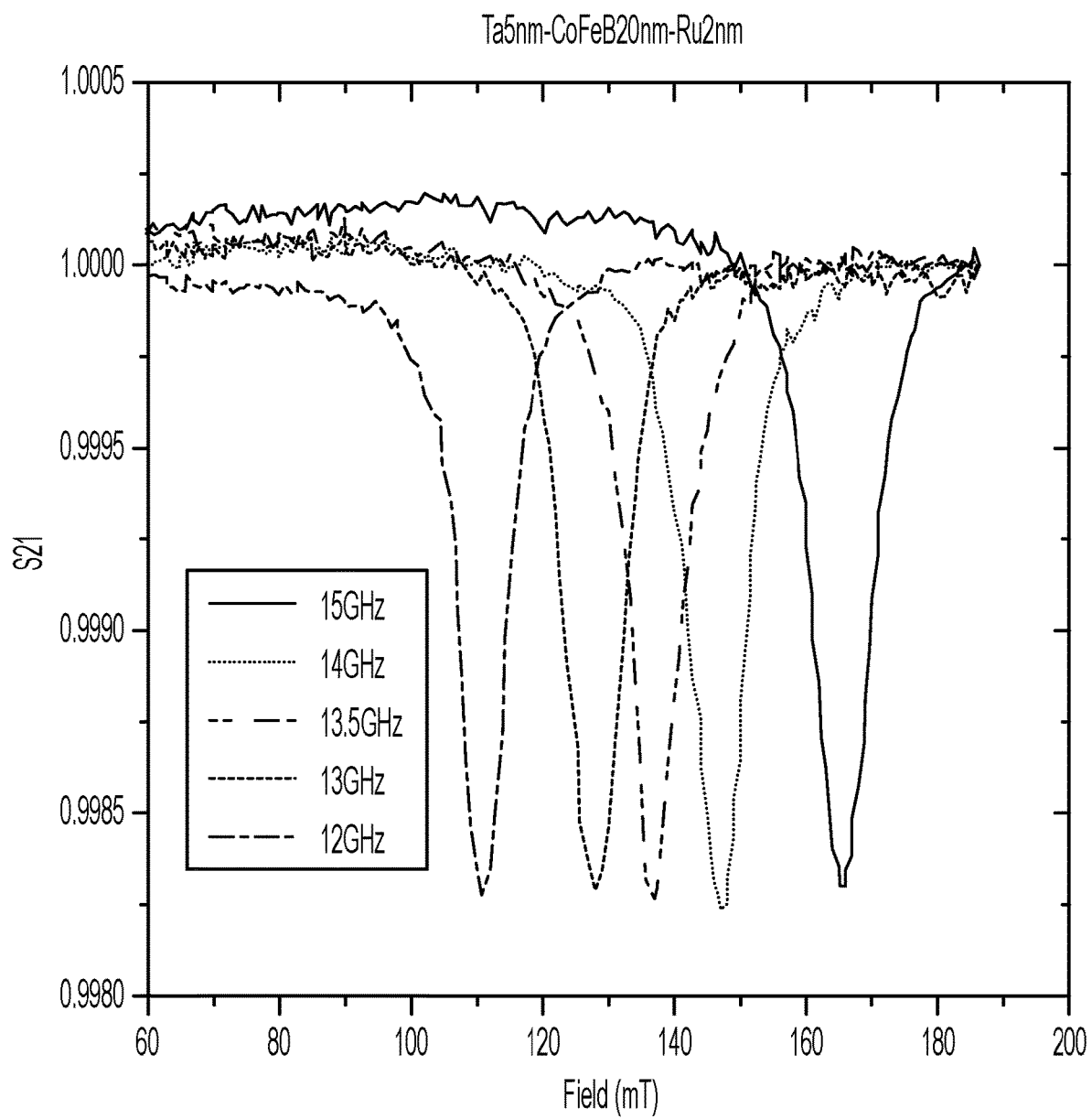
FIG. 12 shows, according to some embodiments, a graph of S21 versus field for data acquired by a hyperpolarization micro-magnetic resonance imager 200.
Figure 13:
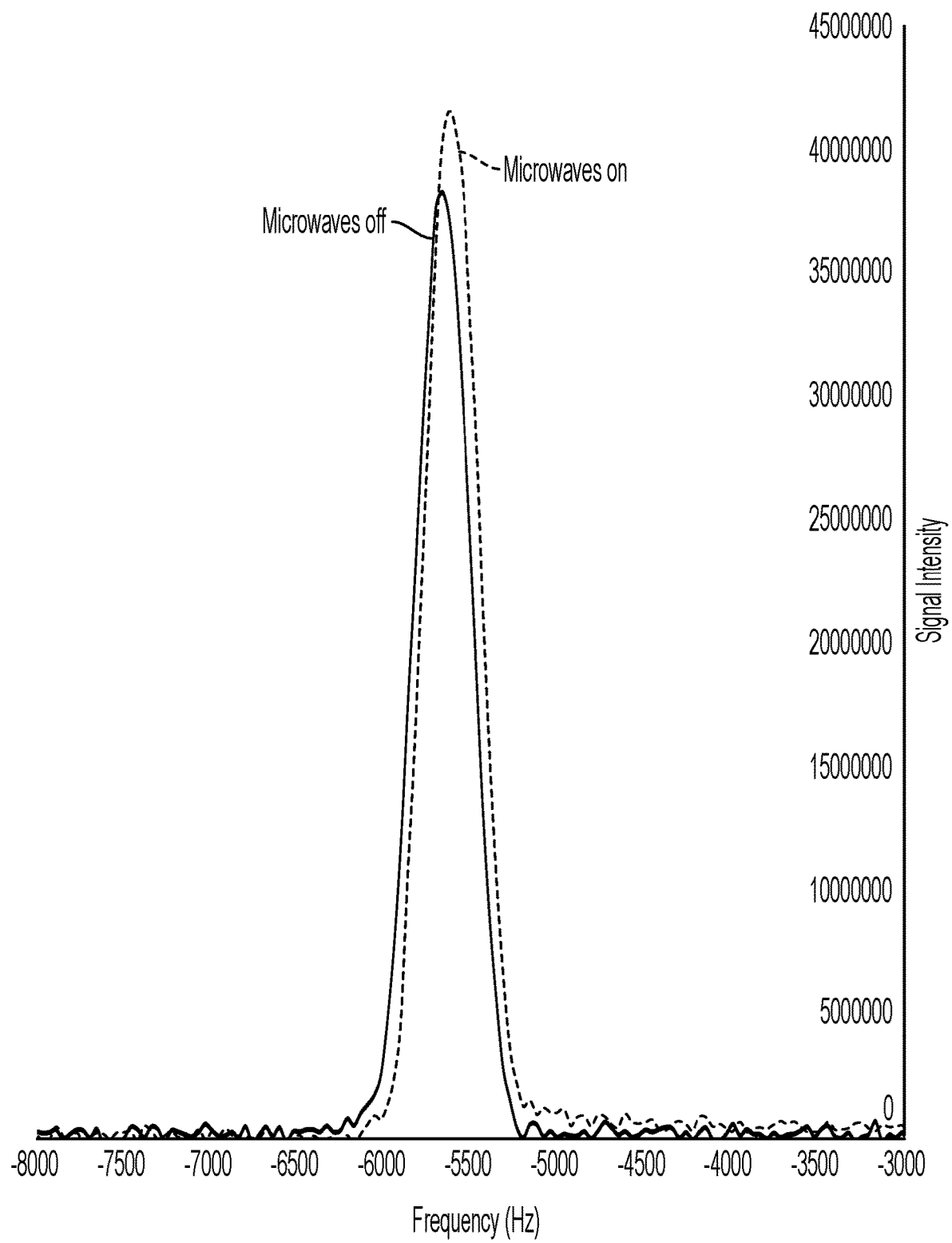
FIG. 13 shows, according to some embodiments, shows a graphical comparison of data from a hyperpolarization micro-magnetic resonance imager 200 with microwaves on and microwaves off.

Hyperpolarization micro-magnetic resonance imager 200 images biological composition 224 with cellular resolution. FIG. 7 shows a screen shot of acquisition software including a free induction decay obtained from the NMR cell, the pulse sequence shown on a digital oscilloscope, and the control software which synchronizes the hyperpolarization, electrode potentials, and temperature with the NMR pulse sequence. FIG. 9 shows a close-up view of integrated imaging cell, hyperpolarizer, bioreactor 217 with shield. FIG. 11 shows NMR spectra obtained as the applied field is varied. The field is varied so that the NMR resonance is at the center of the NMR coil resonance and the signal is a maximum. FIG. 12 shows the ferromagnetic resonance of hyperpolarizer film stack 203. The hyperpolarizer frequency is adjusted to center the ferromagnetic resonance on the field value determined to maximize the NMR signal. FIG. 10 shows an operation mechanism of imaging cell 222, field directions, the NMR coil geometry, and hyperpolarizer film stack 203. Hyperpolarized spin in water perfuse the sample increasing the magnetic resonance signal. FIG. 13 shows signal enhancement with hyperpolarizer film stack 203 turned on, wherein a signal enhancement of 20% occurred.

The processes described herein can be embodied in, and fully automated via, software code modules executed by a computing system that includes one or more general purpose computers or processors. The code modules can be stored in any type of non-transitory computer-readable medium or other computer storage device. Some or all the methods may alternatively be embodied in specialized computer hardware. In addition, the components referred to herein can be implemented in hardware, software, firmware, or a combination thereof.

Many other variations than those described herein can be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

Any logical blocks, modules, and algorithm elements described or used in connection with the embodiments disclosed herein can be implemented as electronic hardware, computer software, or combinations of both. To clearly illustrate this interchangeability of hardware and software, various illustrative components, blocks, modules, and elements have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described or used in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein can be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

The elements of a method, process, or algorithm described in connection with the embodiments disclosed herein can be embodied directly in hardware, in a software module stored in one or more memory devices and executed by one or more processors, or in a combination of the two. A software module can reside in RAM memory, flash memory, ROM memory, EPROM memory, EEPROM memory, registers, hard disk, a removable disk, a CD-ROM, or any other form of non-transitory computer-readable storage medium, media, or physical computer storage known in the art. An example storage medium can be coupled to the processor such that the processor can read information from, and write information to, the storage medium. In the alternative, the storage medium can be integral to the processor. The storage medium can be volatile or nonvolatile.

While one or more embodiments have been shown and described, modifications and substitutions can be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix (s) as used herein is intended to include both the singular and the plural of the term that it modifies, thereby including at least one of that term (e.g., the colorant(s) includes at least one colorants). Option, optional, or optionally means that the subsequently described event or circumstance can or cannot occur, and that the description includes instances where the event occurs and instances where it does not. As used herein, combination is inclusive of blends, mixtures, alloys, reaction products, collection of elements, and the like.

As used herein, a combination thereof refers to a combination comprising at least one of the named constituents, components, compounds, or elements, optionally together with one or more of the same class of constituents, components, compounds, or elements.

All references are incorporated herein by reference.

The use of the terms "a," "an," and "the" and similar referents in the context of describing the invention (especially in the context of the following claims) are to be construed to cover both the singular and the plural, unless otherwise indicated herein or clearly contradicted by context. It can further be noted that the terms first, second, primary, secondary, and the like herein do not denote any order, quantity, or importance, but rather are used to distinguish one element from another. It can also be understood that, although the terms first, second, etc. are, in some instances, used herein to describe various elements, these elements should not be limited by these terms. For example, a first current could be termed a second current, and, similarly, a second current could be termed a first current, without departing from the scope of the various described embodiments. The first current and the second current are both currents, but they are not the same condition unless explicitly stated as such.

The modifier about used in connection with a quantity is inclusive of the stated value and has the meaning dictated by the context (e.g., it includes the degree of error associated with measurement of the particular quantity). The conjunction or is used to link objects of a list or alternatives and is not disjunctive; rather the elements can be used separately or can be combined together under appropriate circumstances.

What is claimed is:

1. A hyperpolarization micro-magnetic resonance imager for three-dimensional imaging of a biological composition with cellular resolution, the hyperpolarization micro-magnetic resonance imager comprising:
a hyperpolarizer source in electrical communication with a hyperpolarizer transmission line and in electrical communication with an NMR console and in electrical communication with an integrated imaging cell, hyperpolarizer, bioreactor and that receives a hyperpolarizer control signal from the NMR console, produces a hyperpolarizer microwave signal from the hyperpolarizer control signal, and communicates the hyperpolarizer microwave signal to the integrated imaging cell, hyperpolarizer, bioreactor via a hyperpolarizer transmission line;
the hyperpolarizer transmission line disposed on a printed circuit board with integrated shield and in electrical communication with a hyperpolarizer source and in electrical communication with the integrated imaging cell and that receives the hyperpolarizer microwave signal from the hyperpolarizer source and communicates the hyperpolarizer microwave signal to the integrated imaging cell, hyperpolarizer, bioreactor;
a nuclear magnetic resonance tuned circuit disposed on the printed circuit board with integrated shield and in electrical communication with a transcoupler and in electrical communication with the integrated imaging cell and that is capacitively coupled to the transcoupler and a nuclear magnetic resonance coil of the integrated imaging cell, hyperpolarizer, bioreactor, and tunes the nuclear magnetic resonance coil to resonate at the same frequency as the proton precession frequency of protons in the imaging cell, and provides an impedance so that a maximum RF power is delivered to a biological composition disposed in the imaging cell;
a magnet disposed on the printed circuit board with integrated shield and in electrical communication with a magnet supply and in magnetic communication with the imaging cell and that receives the magnetic field modulation signal from the magnet supply, produces a magnetic field for performing magnetic resonance imaging of the biological composition in the imaging cell, and communicates the magnetic field to the imaging cell;
a gradient-shim coil disposed on the printed circuit board with integrated shield and in magnetic communication with the magnet and in magnetic communication with the imaging cell and that is interposed between the magnet and the imaging cell and that increases homogeneity of the magnetic field and provides a magnetic field gradient for nuclear magnetic resonance imaging;
a Hall probe and thermometer disposed on the printed circuit board with integrated shield and in electrical communication with a digital control system and that measure the magnetic field and temperature of the imaging cell, produces a magnetic sensor signal that indicates the temperature of the imaging cell and strength of the magnetic field, and communicates the magnetic sensor signal to the digital control system;
the printed circuit board with integrated shield in mechanical communication with the hyperpolarizer transmission line and in mechanical communication with the integrated imaging cell and in mechanical communication with the hyperpolarizer and in mechanical communication with the bioreactor, such that the hyperpolarizer transmission line, the integrated imaging cell, the hyperpolarizer, bioreactor, and the nuclear magnetic resonance tuned circuit are disposed and arranged on the printed circuit board with integrated shield, such that the integrated imaging cell, hyperpolarizer, bioreactor and the Hall probe and thermometer are interposed between a pair of the magnets and a pair of the gradient-shim coils; and
the integrated imaging cell, hyperpolarizer, bioreactor disposed on the printed circuit board with integrated shield and disposed on the hyperpolarizer transmission line and in mechanical communication with the printed circuit board with integrated shield and in mechanical communication with the hyperpolarizer transmission line and that comprises a hyperpolarizer film stack, the imaging cell, and the nuclear magnetic resonance coil.

2. The hyperpolarization micro-magnetic resonance imager of claim 1, further comprising:
the hyperpolarizer film stack disposed on the printed circuit board with integrated shield and in electrical communication with the hyperpolarizer transmission line and in fluid communication with the biological composition and that receives the hyperpolarizer microwave signal from the hyperpolarizer transmission line, produces an electron spin polarization from the hyperpolarizer microwave signal, contacts the biological composition, and produces hyperpolarized water from spin transfer interaction of the polarized electrons in the hyperpolarizer film stack with water in the biological composition.

3. The hyperpolarization micro-magnetic resonance imager of claim 2, wherein the hyperpolarizer film stack comprises:
a spin interface layer that is exposed to an interior sample volume to fluidically interface the hyperpolarizer film stack with the biological composition in the interior sample volume of the imaging cell such that water in the biological composition hydrogen bonds to the spin interface layer and undergoes spin exchange to become the hyperpolarized water;
a polarized electron transport layer that extracts electrons from a ferromagnetic resonance layer and comprises a nonmagnetic material that transports conduction electron spins to the spin interface layer;
the ferromagnetic resonance layer that is interposed between the polarized electron transport layer and the printed circuit board with integrated shield, comprises a magnetic material and a ferromagnetic resonance, converts angular momentum from a microwave field into mobile conduction electrons that are communicated to the polarized electron transport layer;
an adhesion layer that is interposed between the ferromagnetic resonance layer and the printed circuit board with integrated shield and enhances adhesion of the ferromagnetic resonance layer to the substrate; and
a substrate that is interposed between ferromagnetic the resonance layer and the printed circuit board with integrated shield and communicates the microwave field to the ferromagnetic resonance layer from the hyperpolarizer transmission line.

4. The hyperpolarization micro-magnetic resonance imager of claim 1, wherein the imaging cell further comprises:
a base fluid channel disposed on a cell flange and in mechanical communication with the cell flange and in fluid communication with an interior sample volume and that receives the biological composition, and communicates the biological composition to the interior sample volume;
a cap fluid channel disposed on a cell cap and in mechanical communication with the cell cap and in fluid communication with the interior sample volume and that receives the biological composition from the interior sample volume and communicates the biological composition out of the imaging cell;
a cap electrode disposed on the cell cap and in mechanical communication with the cell cap and in electrical communication with the hyperpolarizer film stack and that receives an electrical potential relative to the hyperpolarizer film stack, and provides an electrical bias across the interior sample volume, and provides electrochemical spin control of the imaging cell;
a nuclear magnetic resonance coil disposed on the imaging cell and in mechanical communication with the imaging cell and in electrical communication with a transcoupler and in electrical communication with the nuclear magnetic resonance tuned circuit and that receives NMR transmit signal from an NMR console via the transcoupler, communicates the NMR transmit signal to the biological composition disposed in the imaging cell, and receives NMR receive signal from the biological composition in the imaging cell;
the imaging cell disposed on the printed circuit board with integrated shield and in mechanical communication with the printed circuit board with integrated shield and that comprises a cell wall that surroundingly bounds the interior sample volume, the cell flange that mechanically engages the hyperpolarizer film stack and through which is disposed the base fluid channel, and the cell cap through which is disposed the cap fluid channel, such that the hyperpolarizer film stack is interposed between the cell flange and the hyperpolarizer transmission line, and the hyperpolarizer transmission line is interposed between the hyperpolarizer film stack and the printed circuit board with integrated shield;
a fluid seal in mechanical communication with the imaging cell and in mechanical communication with the hyperpolarizer film stack and that mechanically engages the cell flange of the imaging cell and the hyperpolarizer film stack and fluidically seals the imaging cell to the hyperpolarizer film stack;
the cell cap that fluidically seals the imaging cell and receives the cap fluid channel;
the cell flange that fluidically seals the imaging cell against the hyperpolarizer film stack;
the cell wall that bounds the interior sample volume; and
the interior sample volume that is bounded by the interior sample volume.

5. The hyperpolarization micro-magnetic resonance imager of claim 1, further comprising:
an NMR console in electrical communication with the hyperpolarizer source and in electrical communication with a transcoupler and in electrical communication with a cell controller and in electrical communication with gradient amplifiers and that receives NMR receive signal from the transcoupler, produces a hyperpolarizer control signal, an imaging cell electrode and flow control signal, a gradient waveform (x, y, z), and an NMR transmit signal in response to receipt of the NMR receive signal, communicates the NMR transmit signal to the transcoupler, communicates the hyperpolarizer control signal to the hyperpolarizer source, communicates the imaging cell electrode and flow control signal to the cell controller, and communicates the gradient waveform (x, y, z) to the gradient amplifiers.

6. The hyperpolarization micro-magnetic resonance imager of claim 5, further comprising:
the transcoupler in electrical communication with the NMR console and in electrical communication with the nuclear magnetic resonance coil and that receives the NMR transmit signal from the NMR console, communicates the NMR transmit signal to the nuclear magnetic resonance coil, receives the NMR receive signal from the nuclear magnetic resonance coil, and communicates the NMR receive signal to the NMR console.

7. The hyperpolarization micro-magnetic resonance imager of claim 5, further comprising:
gradient amplifiers in electrical communication with the NMR console and in electrical communication with the gradient-shim coil and that receives the gradient waveform (x, y, z) from the NMR console, produces a gradient drive current from the gradient waveform (x, y, z), and communicates the gradient drive current to the gradient-shim coil to drive the gradient-shim coil.

8. The hyperpolarization micro-magnetic resonance imager of claim 5, further comprising:
a cell controller in electrical communication with the NMR console and in electrical communication with the imaging cell and that receives the imaging cell electrode and flow control signal from the NMR console, produces a hyperpolarizer MW transmit signal based on the imaging cell electrode and flow control signal, such that the cell controller controls electrode bias, temperature read out, and fluid flow of the imaging cell.

9. The hyperpolarization micro-magnetic resonance imager of claim 1, further comprising:
a microwave detector in electrical communication with the integrated imaging cell, hyperpolarizer, bioreactor and in electrical communication with a digital control system and that receives a hyperpolarizer MW transmit signal from the integrated imaging cell, hyperpolarizer, bioreactor, detects microwave power of the hyperpolarizer MW transmit signal, and produces a hyperpolarizer power signal from the hyperpolarizer power signal, such that the hyperpolarizer power signal indicates the microwave power of the hyperpolarizer MW transmit signal.

10. The hyperpolarization micro-magnetic resonance imager of claim 9, further comprising:
the digital control system in electrical communication with a magnet supply and in electrical communication with the Hall probe and thermometer and in electrical communication with the microwave detector and that receives the hyperpolarizer power signal from the microwave detector, receives the magnetic sensor signal from the Hall probe and thermometer, monitors a ferromagnetic resonance of the hyperpolarizer film stack from the hyperpolarizer power signal, produces a magnet control signal to adjust the microwave drive frequency of the magnet supply to be at the magnetic resonance frequency of the imaging cell.

11. The hyperpolarization micro-magnetic resonance imager of claim 10, further comprising:
the magnet supply in electrical communication with the digital control system and in electrical communication with the magnet and that receives the magnet control signal from the digital control system, produces a magnetic field modulation signal from the magnet control signal, and communicates the magnetic field modulation signal to the magnet, such that the magnet supply adjusts and sweeps the magnetic field so that the proton precession frequency is matched to the resonance of a nuclear magnetic resonance coil and monitors the ferromagnetic resonance of the hyperpolarizer film stack.

12. The hyperpolarization micro-magnetic resonance imager of claim 1, further comprising:
a shim controller in electrical communication with the gradient-shim coil and that produces a shim current and communicates the shim current to the gradient-shim coil to adjust homogeneity of the magnetic field in the imaging cell.

13. A process for three-dimensional imaging of a biological composition with cellular resolution with a hyperpolarization micro-magnetic resonance imager, the process comprising: providing the biological composition to be imaged; disposing the biological composition in an imaging cell; providing a hyperpolarizer microwave signal to the imaging cell via a hyperpolarizer transmission line; applying a magnetic field to the imaging cell; and acquiring an image of the biological composition from the imaging cell.

* * * * *